(12) United States Patent
Jung et al.

(10) Patent No.: US 10,679,997 B2
(45) Date of Patent: Jun. 9, 2020

(54) SEMICONDUCTOR DEVICE COMPRISING WORK FUNCTION METAL PATTERN IN BOUNDARY REGION AND METHOD FOR FABRICATING THE SAME

(71) Applicant: Samsung Electronics Co., Ltd., Suwon-si, Gyeonggi-do (KR)

(72) Inventors: Ki Wook Jung, Seoul (KR); Dong Oh Kim, Daegu (KR); Seok Han Park, Hwaseong-si (KR); Chan Sic Yoon, Anyang-si (KR); Ki Seok Lee, Hwaseong-si (KR); Ho In Lee, Suwon-si (KR); Ju Yeon Jang, Hwaseong-si (KR); Je Min Park, Suwon-si (KR); Jin Woo Hong, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/391,888

(22) Filed: Apr. 23, 2019

(65) Prior Publication Data
US 2019/0252393 A1      Aug. 15, 2019

Related U.S. Application Data

(63) Continuation of application No. 15/828,934, filed on Dec. 1, 2017, now Pat. No. 10,332,894.

(30) Foreign Application Priority Data

Feb. 8, 2017   (KR) ........................ 10-2017-0017632

(51) Int. Cl.
*H01L 27/108*      (2006.01)
*H01L 21/8238*     (2006.01)
(Continued)

(52) U.S. Cl.
CPC .. *H01L 27/1104* (2013.01); *H01L 21/823807* (2013.01); *H01L 23/535* (2013.01);
(Continued)

(58) Field of Classification Search
CPC ............ H01L 27/1104; H01L 29/1029; H01L 27/10852; H01L 27/10867;
(Continued)

(56) References Cited

U.S. PATENT DOCUMENTS 6,624,019 B2    9/2003  Kim
8,569,817 B2   10/2013  Kwon
(Continued)

FOREIGN PATENT DOCUMENTS

KR          1301159      8/2013
KR      20140009165 A    1/2014
(Continued)

*Primary Examiner* — Steven H Loke
*Assistant Examiner* — Juanita B Rhodes
(74) *Attorney, Agent, or Firm* — Harness, Dickey & Pierce, P.L.C.

(57) ABSTRACT

A semiconductor device and method for fabricating the same are provided. The semiconductor device includes a substrate including a cell region, a core region, and a boundary region between the cell region and the core region, a boundary element isolation layer in the boundary region of the substrate to separate the cell region from the core region, a high-k dielectric layer on at least a part of the boundary element isolation layer and the core region of the substrate, a first work function metal pattern comprising a first extension overlapping the boundary element isolation layer on the high-k dielectric layer, and a second work function metal
(Continued)

pattern comprising a second extension overlapping the boundary element isolation layer on the first work function metal pattern, wherein a first length of the first extension is different from a second length of the second extension.

18 Claims, 18 Drawing Sheets

(51) Int. Cl.
  *H01L 27/11* (2006.01)
  *H01L 27/092* (2006.01)
  *H01L 29/10* (2006.01)
  *H01L 23/535* (2006.01)

(52) U.S. Cl.
  CPC ...... *H01L 27/092* (2013.01); *H01L 27/10852* (2013.01); *H01L 27/10867* (2013.01); *H01L 27/10885* (2013.01); *H01L 27/10888* (2013.01); *H01L 27/10894* (2013.01); *H01L 29/1029* (2013.01); *H01L 21/823842* (2013.01)

(58) Field of Classification Search
  CPC ......... H01L 27/10888; H01L 27/10894; H01L 27/10885; H01L 21/823807; H01L 21/823842; H01L 27/092; H01L 23/535
  See application file for complete search history.

(56) References Cited

U.S. PATENT DOCUMENTS

| | | | |
|---|---|---|---|
| 9,126,877 | B2 | 9/2015 | Davidson et al. |
| 9,140,990 | B2 | 9/2015 | Tanitsu et al. |
| 9,318,495 | B2 | 4/2016 | Kang |
| 9,423,694 | B2 | 8/2016 | Tanitsu et al. |
| 9,429,848 | B2 | 8/2016 | Tanitsu et al. |
| 2009/0032887 | A1 | 2/2009 | Jang et al. |
| 2010/0065898 | A1 | 3/2010 | Choi et al. |
| 2014/0167177 | A1* | 6/2014 | Kim .................. H01L 27/1104 257/369 |
| 2014/0246729 | A1 | 9/2014 | Jang et al. |
| 2016/0049398 | A1 | 2/2016 | Jang et al. |
| 2016/0064513 | A1 | 3/2016 | Richter et al. |
| 2016/0163708 | A1 | 6/2016 | Jang et al. |

FOREIGN PATENT DOCUMENTS

| | | |
|---|---|---|
| KR | 1392140 | 4/2014 |
| KR | 1429868 | 8/2014 |
| KR | 20140110146 A | 9/2014 |
| KR | 20160067618 A | 6/2016 |
| WO | WO-2012040859 A1 | 4/2012 |

* cited by examiner

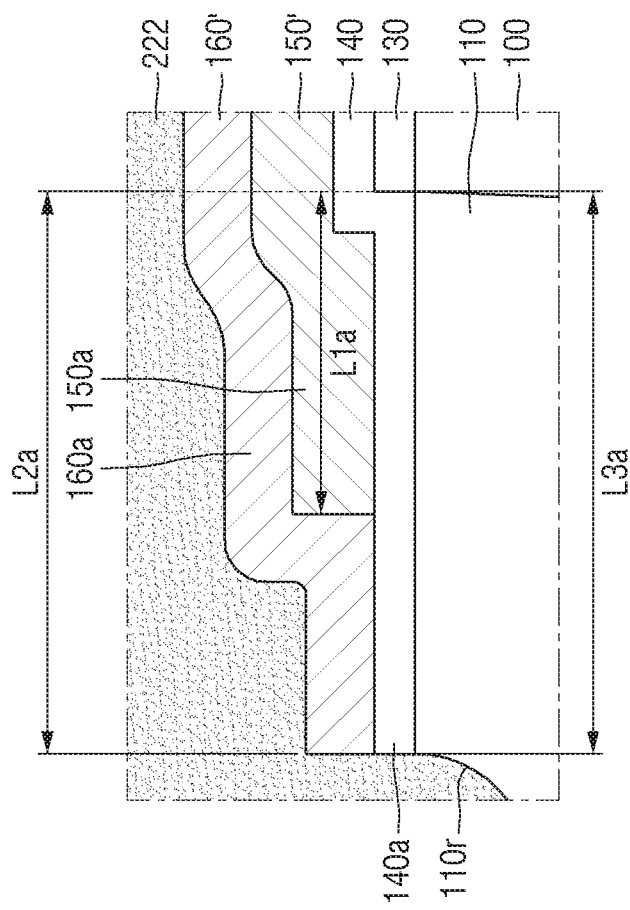

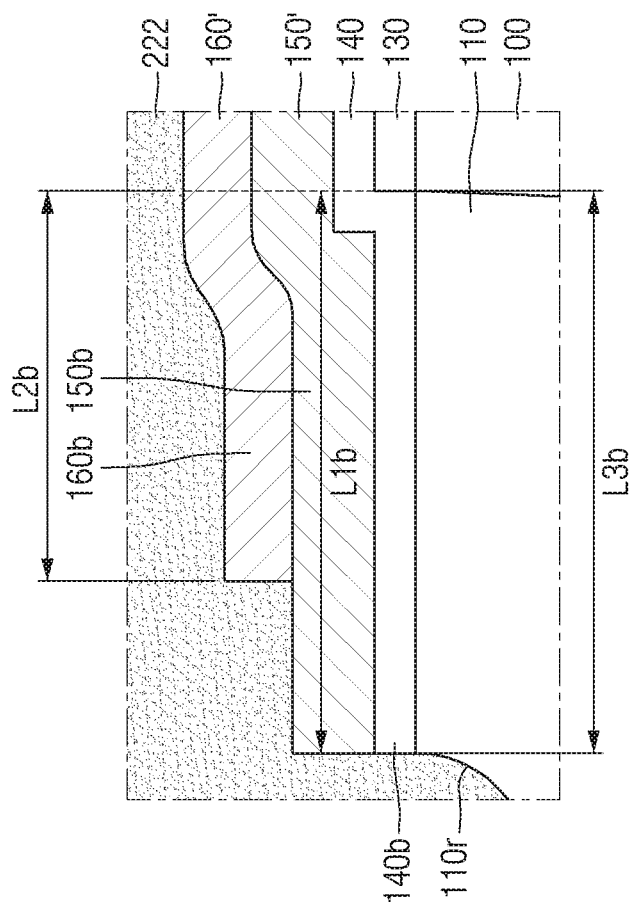

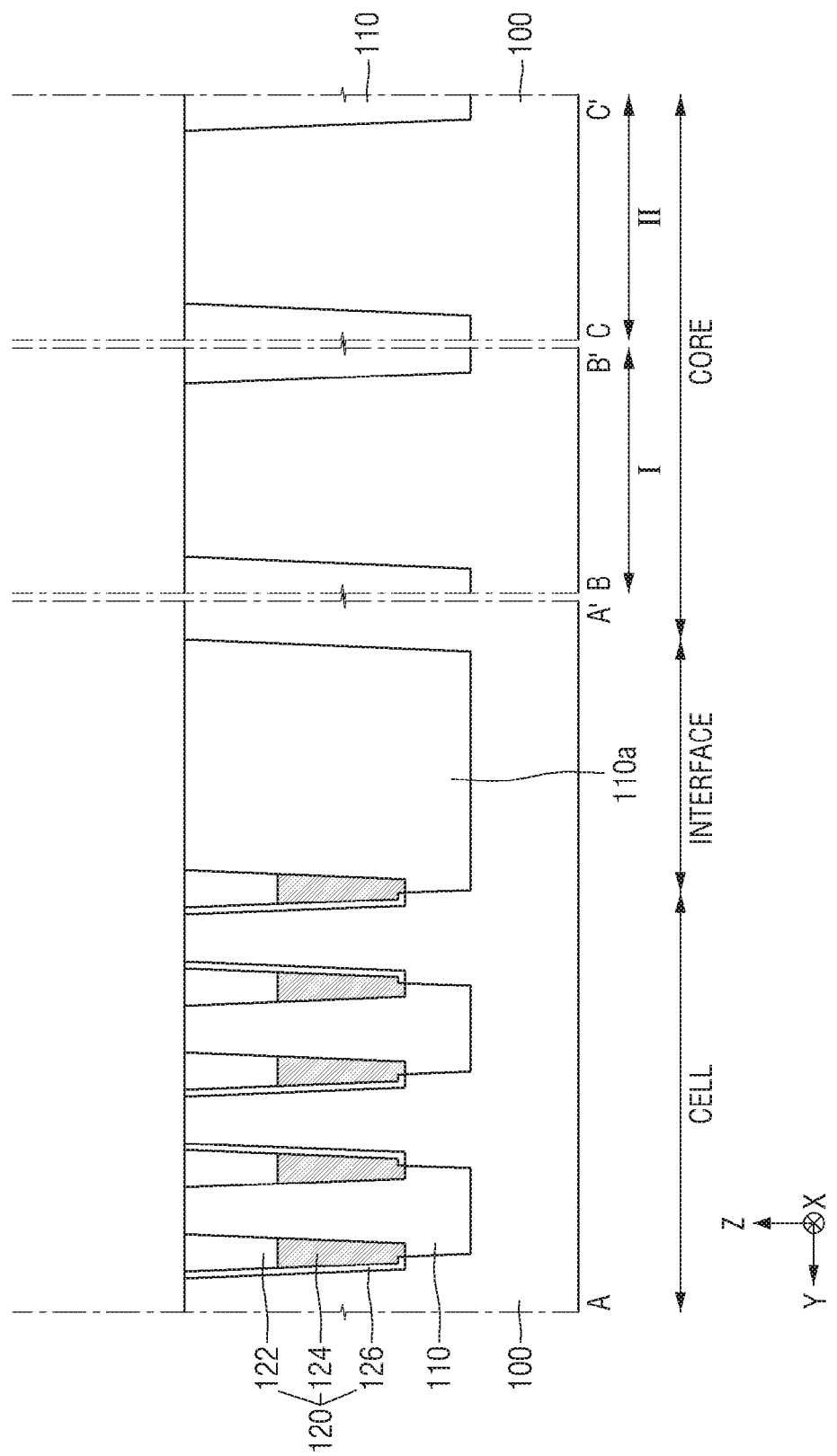

US 10,679,997 B2

SEMICONDUCTOR DEVICE COMPRISING WORK FUNCTION METAL PATTERN IN BOUNDARY REGION AND METHOD FOR FABRICATING THE SAME

This application is a continuation of U.S. application Ser. No. 15/828,934 filed on Dec. 1, 2017, which claims priority from Korean Patent Application No. 10-2017-0017632 filed on Feb. 8, 2017 in the Korean Intellectual Property Office, the disclosure of each of which is incorporated herein by reference in its entirety.

BACKGROUND OF THE INVENTION

1. Field of the Invention

The present inventive concepts relate to a semiconductor device and/or a method of fabricating the same.

2. Description of the Related Art

A semiconductor memory element such as DRAM has a cell region and a core region. In particular, the core region includes a region in which a PMOS transistor is formed, and a region in which an NMOS transistor is formed. Recently, a structure is used in which a p-type gate is disposed in a region in which the PMOS transistor is formed and an n-type gate is disposed in a region in which the NMOS transistor is formed.

Further, as the degree of integration of the semiconductor memory element increases, a leakage current through the gate dielectric layer of the transistor increases. As a result, a gate dielectric layer is formed, using a high dielectric material (high-k dielectric material).

SUMMARY OF THE INVENTION

An aspect of the present inventive concepts provides a semiconductor device with improved degree of integration and reliability.

Another aspect provides a method for fabricating a semiconductor device with improved degree of integration and reliability.

The technical problem of the present inventive concepts is not limited to the technical problem mentioned above, and another technical problem which is not mentioned will be clearly understood by those skilled in the art from the following description.

According to some example embodiments of the present inventive concepts, there is provided a semiconductor device including, a substrate including a cell region, a core region, and a boundary region between the cell region and the core region, a boundary element isolation layer in the substrate of the boundary region to separate the cell region from the core region, a high-k dielectric layer on at least a part of the boundary element isolation layer and the substrate of the core region, a first work function metal pattern which includes a first extension overlapping the boundary element isolation layer on the high-k dielectric layer, and a second work function metal pattern which includes a second extension overlapping the boundary element isolation layer on the first work function metal pattern, wherein a first length of the first extension extending in a direction from the core region toward the cell region is different from a second length of the second extension extending in a direction from the core region toward the cell region.

According to some example embodiments of the present inventive concepts, there is provided a semiconductor device including, a substrate including a cell region, a core region, and a boundary region between the cell region and the core region, a boundary element isolation layer in the boundary region of the substrate to separate the cell region from the core region, a high-k dielectric layer on at least a part of the boundary element isolation layer and the core region of the substrate, a first work function metal pattern including a first extension overlapping the boundary element isolation layer on the substrate, and a second work function metal pattern including a second extension overlapping the boundary element isolation layer on the first work function metal pattern, wherein the boundary element isolation layer includes a recess, which does not overlap the first and second extensions, and is adjacent to at least one of the first and second extensions.

According to some example embodiments of the present inventive concepts, there is provided a semiconductor device including a cell region in a substrate, an element isolation layer around the cell region, a high-k dielectric layer extending onto a portion of the element isolation layer from a direction opposite from a direction of the cell region, a first work function metal pattern extending a first length onto the element isolation layer from the direction opposite from the direction of the cell region, and a second work function metal pattern extending a second length onto the element isolation layer from the direction opposite from the direction of the cell region. At least a portion of the second work function metal pattern is on the first work function metal pattern. The first work function metal pattern is on the high-k dielectric layer. The second length is different from the first length.

BRIEF DESCRIPTION OF THE DRAWINGS

The above and other aspects and features of the present inventive concepts will become more apparent by describing in detail some example embodiments thereof with reference to the attached drawings, in which:

FIG. 4a is an enlarged view of a region D of FIG. 3.

FIG. 4b is a diagram for illustrating a boundary region of a semiconductor device according to some example embodiments of the present inventive concepts.

FIGS. 5 to 16 are intermediate step diagrams for explaining a method for fabricating a semiconductor device according to some example embodiments of the present inventive concepts.

DETAILED DESCRIPTION OF THE INVENTION

Hereinafter, a semiconductor device according to some example embodiments of the present inventive concepts will be described with reference to FIGS. 1 to 4a.

Figure 1:
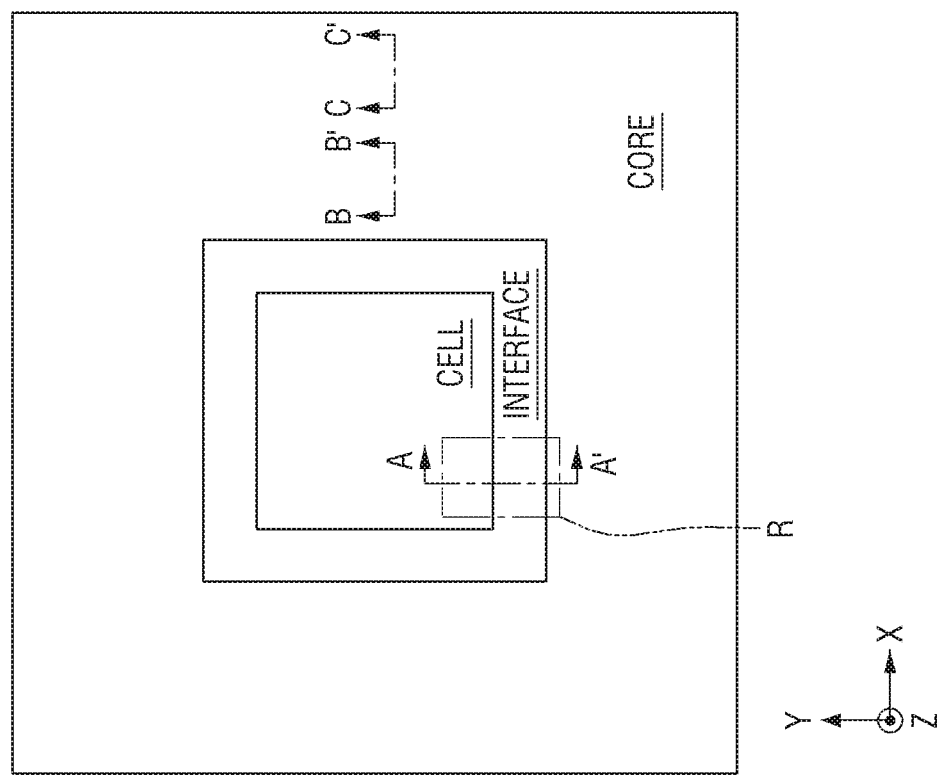
FIG. 1 is a layout diagram for illustrating a semiconductor device according to some example embodiments of the present inventive concepts.
Figure 2:
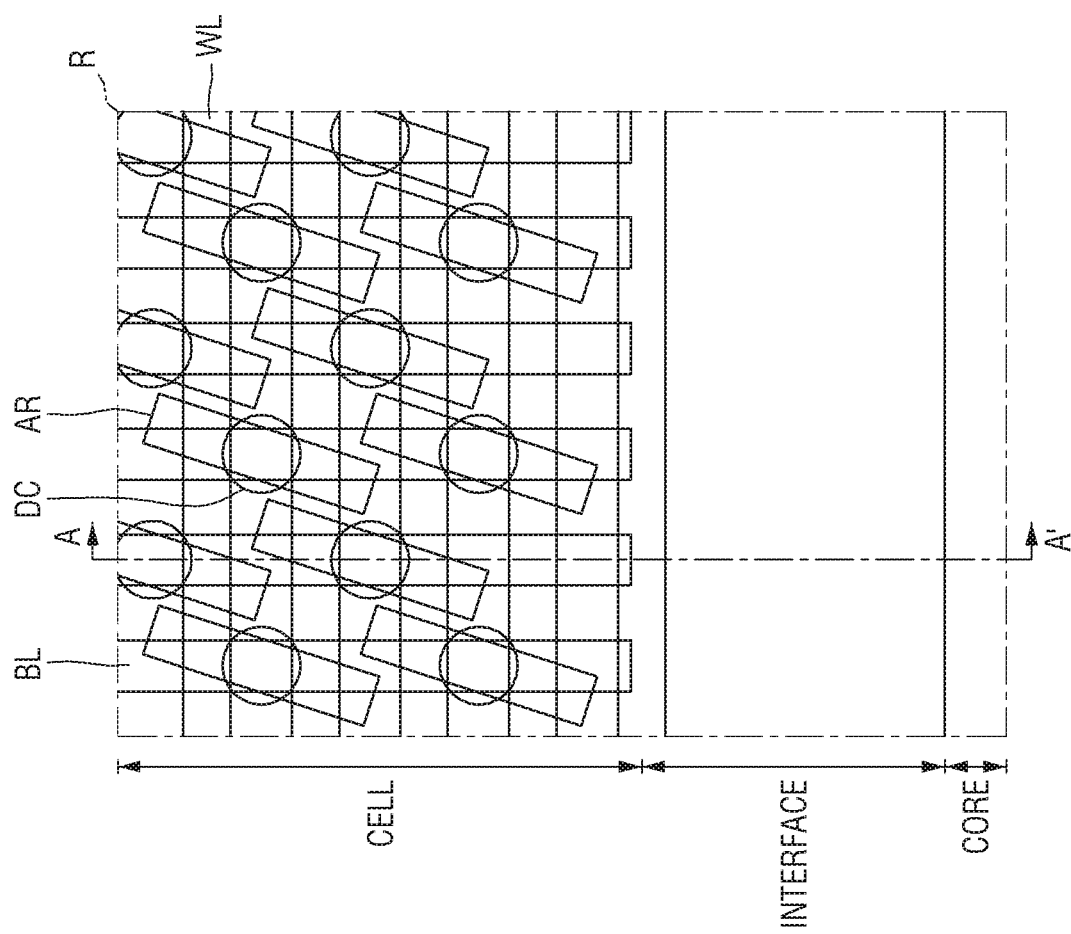
FIG. 2 is an enlarged view of a region R of FIG. 1.
Figure 3:
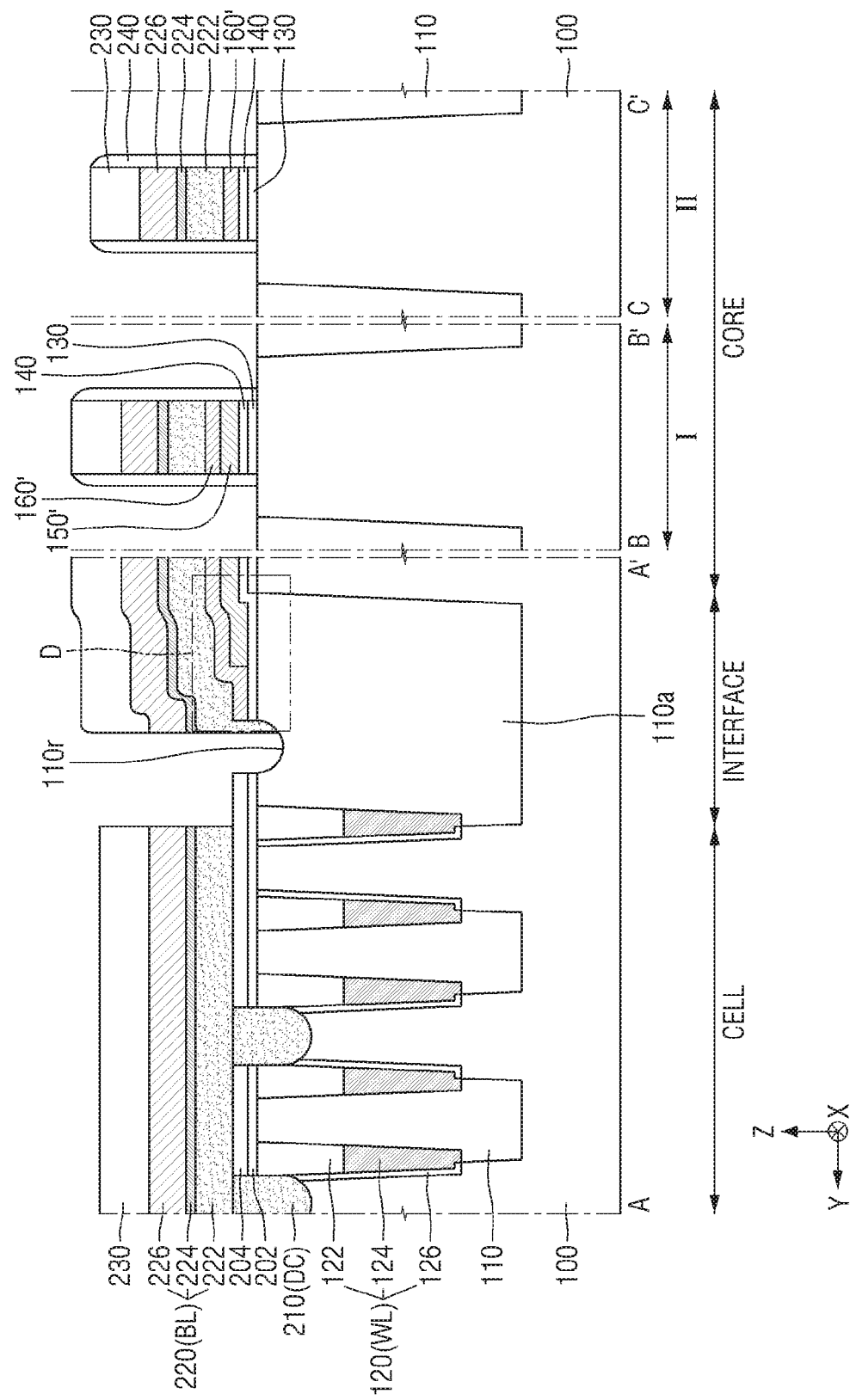
FIG. 3 is a cross-sectional view taken along lines A-A', B-B', and C-C' of FIG. 1.

FIG. 1 is a layout diagram for illustrating a semiconductor device according to some example embodiments of the present inventive concepts. FIG. 2 is an enlarged view of a region R of FIG. 1. FIG. 3 is a cross-sectional view taken along lines A-A', B-B', and C-C' of FIG. 1. FIG. 4a is an enlarged view of a region D of FIG. 3.

Referring to FIG. 1, a semiconductor device according to some example embodiments of the present inventive concepts includes a cell region (CELL), a core region (CORE), and a boundary region (INTERFACE).

In the cell region (CELL), semiconductor cells may be disposed to form an array. For example, when the semiconductor device to be formed is a semiconductor memory device, semiconductor memory cells may be disposed in the cell region (CELL) to form an array.

The core region (CORE) may be disposed around the cell region (CELL) or may be disposed in another region different from the cell region (CELL). Some control elements and dummy elements may be formed in the core region (CORE). As a result, a circuit necessary for controlling the semiconductor cells formed in the cell region (CELL) may be disposed in the core region (CORE).

The boundary region (INTERFACE) may be disposed between the cell region (CELL) and the core region (CORE). Specifically, the boundary region (INTERFACE) may be disposed to be adjacent to the cell region (CELL) and the core region (CORE) between the cell region (CELL) and the core region (CORE). For example, as illustrated in FIG. 1, the boundary region (INTERFACE) may be disposed between the cell region (CELL) and the core region (CORE) disposed around the cell region (CELL). As a result, the boundary region (INTERFACE) may wrap around the cell region (CELL).

A boundary element isolation layer (110a of FIG. 3) may be disposed in the boundary region (INTERFACE). As a result, the boundary region (INTERFACE) may separate the cell region (CELL) from the core region (CORE).

Referring to FIG. 2, an active region AR, a word line WL, a bit line BL and a direct contact DC may be disposed in the cell region (CELL).

The active region AR may be defined by the element isolation layer (110 of FIG. 3).

As the design rule of the semiconductor device decreases, the active region AR may be disposed in the form of a diagonal bar. Specifically, the active region AR may be disposed in the form of bar extending in an arbitrary direction other than the first direction X and the second direction Y, on the plane in which the first direction X and the second direction Y extend.

Also, the active region AR may be in the form of a plurality of bars extending in the directions parallel to each other. At this time, the center of one active region AR of the plurality of active regions AR may be disposed to be adjacent to the distal end of the other active region AR.

Impurities may be implanted into the active region AR to form source and drain regions. Implantation of the impurities into the active region AR may be performed in an ion implantation process, but the example embodiments of the present disclosure are not limited thereto.

The word line WL may extend along the first direction X across the active region AR. A plurality of word lines WL may extend in parallel to each other and may be spaced apart from each other at equal intervals. For example, the plurality of word lines WL may be buried in the substrate (100 of FIG. 3) to extend parallel to each other and may be spaced apart from each other at equal intervals.

The bit line BL may extend along the second direction Y different from the first direction X across the active region AR and the word line WL. For example, the second direction Y may be a direction orthogonal to the first direction X.

Therefore, the bit line BL may diagonally across the active region AR and may vertically across the word line WL.

A plurality of bit lines BL may extend parallel to each other and may be spaced apart from each other at equal intervals. For example, the plurality of bit lines BL may extend parallel to each other on the substrate (100 of FIG. 3) and may be spaced apart from each other at equal intervals.

The direct contact DC may be disposed at the center of the active region AR. Further, the direct contact DC may be electrically connected to the bit line BL. As a result, the center of the active region AR may be electrically connected to the bit line BL.

Referring to FIG. 3, the semiconductor device according to some example embodiments of the present inventive concepts includes a substrate 100, an element isolation layer 110, a word line pattern 120, first and second insulating layers 202 and 204, a bit line pattern 220, a direct contact pattern 210, a capping layer 230, a gate insulating layer 130, a high-k dielectric layer 140, first and second work function metal patterns 150' and 160' and a gate spacer 240.

The substrate 100 may have a structure in which a base substrate and an epitaxial layer are laminated, but the present disclosure is not limited thereto. The substrate 100 may be a silicon substrate, a gallium arsenide substrate, a silicon germanium substrate, a ceramic substrate, a quartz substrate, a display glass substrate or the like, and may be an SOI (semiconductor on insulator) substrate. As an example, the substrate 100 may be a silicon substrate.

The substrate 100 includes a cell region (CELL), a core region (CORE), and a boundary region (INTERFACE). At this time, the core region (CORE) may include first and second regions I and II. As illustrated, the first and second regions I and II may be disposed to be spaced apart from each other, but the example embodiments of the present disclosure are not limited thereto, and the first and second regions I and II may be disposed to be adjacent to each other.

In some example embodiments, conductive transistors different from each other may be formed in the first and second regions I and II. For example, a PMOS transistor may be formed in the first region I, and an NMOS transistor may be formed in the second region II. In this case, the substrate 100 of the first region I may be doped with an n-type impurity, and the substrate 100 of the second region II may be doped with a p-type impurity.

The element isolation layer 110 may define an active region (AR of FIG. 2) disposed on the top of the substrate 100. The element isolation layer 110 may include silicon oxide, silicon nitride or a combination thereof, but the example embodiments of the present disclosure are not limited thereto. The element isolation layer 110 may be a single layer made of one kind of insulating material or may be multi-layers made up of combinations of several kinds of insulating materials.

The element isolation layer 110 may include a boundary element isolation layer 110a disposed in the boundary region (INTERFACE). That is, the boundary element isolation layer 110a may be disposed in the substrate 100 of the boundary region (INTERFACE). Therefore, the boundary element isolation layer 110a may separate the cell region (CELL) from the core region (CORE). That is, the boundary region (INTERFACE) may be defined by the boundary element isolation layer 110a.

The boundary element isolation layer 110a may include a recess 110r on its upper surface. This will be specifically described later in the description of FIG. 4a.

The word line pattern 120 may be disposed on the substrate 100 of the cell region (CELL). The word line pattern 120 may include a buried dielectric layer 126, a buried conductive layer 124, and a buried insulating layer 122. The word line pattern 120 may correspond to the word line WL of FIG. 2. That is, the word line pattern 120 may extend in the first direction X. For example, as illustrated in FIG. 3, the word line pattern 120 may be buried in the substrate 100 of the cell region (CELL) to extend in the first direction X.

Specifically, a word line trench extending in the first direction X may be formed on the substrate 100. At this time, the lower surface of the word line trench may be higher than the lower surface of the element isolation layer 110. The buried dielectric layer 126 may be disposed along the word line trench. Further, the buried conductive layer 124 and the buried insulating layer 122 may be sequentially laminated on the buried dielectric layer 126. As a result, the buried dielectric layer 126, the buried conductive layer 124, and the buried insulating layer 122 may fill the word line trench to form the word line pattern 120. At this time, the buried conductive layer 124 may be electrically insulated from the substrate 100 by the buried dielectric layer 126.

As illustrated, the word line pattern 120 may be disposed on the element isolation layer 110. However, the present disclosure is not limited thereto, and the word line pattern 120 may not be disposed on the element isolation layer 110.

The first and second insulating layers 202 and 204 may be disposed on the substrate 100 and the element isolation layer 110. Specifically, the first and second insulating layers 202 and 204 may be disposed on the substrate 100, the element isolation layer 110, and the word line pattern 120 of the cell region (CELL).

The first and second insulating layers 202 and 204 may include materials different from each other. For example, the first insulating layer 202 may contain silicon oxide, and the second insulating layer 204 may contain silicon nitride. However, the example embodiments of the present disclosure are not limited thereto, and the first and second insulating layers 202 and 204 may be formed of a single layer containing the same material. Further, each of the first and second insulating layers 202 and 204 may be formed of multi-layers, respectively.

The bit line pattern 220 may be disposed on the substrate 100. The bit line pattern 220 may correspond to the bit line BL of FIG. 2. That is, the bit line pattern 220 may extend in the second direction Y on the substrate 100 of the cell region (CELL). Specifically, the bit line pattern 220 may be disposed on the first and second insulating layers 202 and 204.

The bit line pattern 220 may be a single layer, but may be multi-layers including the first to third conductive layers 222, 224 and 226 as illustrated. That is, the bit line pattern 220 may be formed by sequentially disposing the first to third conductive layers 222, 224 and 226 on the first and second insulating layers 202 and 204.

Each of the first to third conductive layers 222, 224, and 226 may include polysilicon, TiN, TiSiN, tungsten, tungsten silicide or a combination thereof. For example, the first conductive layer 222 may contain polysilicon, the second conductive layer 224 may contain TiSiN, and the third conductive layer 226 may contain tungsten. However, the example embodiments of the present disclosure are not limited thereto.

The direct contact pattern 210 may be disposed on the substrate 100 of the cell region (CELL) through the first and second insulating layers 202 and 204. The direct contact pattern 210 may correspond to the direct contact DC of FIG. 2. That is, the direct contact pattern 210 is disposed on the substrate 100 and may be electrically connected to the bit line pattern 220. As a result, the substrate 100 disposed below the direct contact pattern 210 may be electrically connected to the bit line pattern 220.

The capping layer 230 may be disposed on the bit line pattern 220. That is, the capping layer 230 may extend in the second direction Y on the bit line pattern 220 of the cell region (CELL).

The capping layer 230 may contain silicon nitride, but the example embodiments of the present disclosure are not limited thereto.

The gate insulating layer 130 may be disposed on the substrate 100 of the core region (CORE). Specifically, the gate insulating layer 130 may be disposed on the substrate 100 of the core region (CORE) adjacent to the boundary region (INTERFACE). Further, the gate insulating layer 130 may be disposed in a part on the substrate 100 of the first region I, and may be disposed in a part on the substrate of the second region II. However, the example embodiments of the present disclosure are not limited thereto, and the gate insulating layer 130 may be disposed on the element isolation layer 110 of the core region (CORE). Further, the gate insulating layer 130 disposed on the substrate 100 of the core region (CORE) adjacent to the boundary region (INTERFACE) may further extend in the second direction Y, and may be disposed on the boundary element isolation layer 110a.

The gate insulating layer 130 disposed on the substrate 100 of the first and second regions I and II may extend in the first direction X. However, the example embodiments of the present disclosure are not limited thereto, and the gate insulating layer 130 may extend in various directions. For example, the gate insulating layer 130 may also extend in the second direction Y.

Further, the gate insulating layer 130 may extend in the directions different from each other in the first and second regions I and II. For example, the gate insulating layer 130 disposed on the substrate 100 of the first region I may extend in the first direction X, and the gate insulating layer 130 disposed on the substrate 100 of the second region II may extend in the second direction Y.

The gate insulating layer 130 may contain silicon oxide, but the example embodiments of the present disclosure are not limited thereto.

The high-k dielectric layer 140 may be disposed on the substrate 100 of the boundary region (INTERFACE) and the core region (CORE). Specifically, the high-k dielectric layer 140 may be disposed on at least a part of the boundary element isolation layer 110a in the boundary region (INTERFACE). Further, the high-k dielectric layer 140 may be disposed on the gate insulating layer 130 in the core region (CORE).

The high-k dielectric layer 140 may contain silicon oxide, silicon nitride, silicon oxynitride ONO (oxide/nitride/oxide) or a high-k dielectric material having a dielectric constant than higher silicon oxide.

For example, the high-k dielectric layer 140 may contain hafnium oxide (HfO), hafnium silicate (HfSiO), hafnium oxynitride (HfON), hafnium silicon oxynitride (HfSiON), lanthanum oxide (LaO), lanthanum aluminium oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO) or a combination thereof. However, the example embodiments of the present disclosure are not limited thereto.

Although not illustrated, an interface layer may be further interposed between the gate insulating layer 130 and the high-k dielectric layer 140. The interface layer may prevent a defective interface between the gate insulating layer 130 and the high-k dielectric layer 140.

The first work function metal pattern 150' may be disposed on the substrate 100 of the boundary region (INTERFACE) and the core region (CORE). Specifically, the first work function metal pattern 150' may be disposed on the boundary element isolation layer 110a or the high-k dielectric layer 140 in the boundary region (INTERFACE). Further, the first work function metal pattern 150' may be disposed on the high-k dielectric layer 140 in the first region I.

However, the first work function metal pattern 150' may not be disposed in the second region II. That is, the first work function metal pattern 150' may be disposed on the high-k dielectric layer 140 of the first region I, and may not be disposed on the substrate 100 of the second region II.

In some example embodiments, the first region I may be a region in which the PMOS transistor is formed. That is, the substrate 100 of the first region I may be doped with an n-type impurity. That is, the first work function metal pattern 150' disposed on the high-k dielectric layer 140 of the first region I may be a metal layer which adjusts the threshold voltage of the PMOS transistor.

For example, the first work function metal pattern 150' may be formed of tungsten (W), tantalum (Ta), aluminum (Al), ruthenium (Ru), platinum (Pt), titanium nitride (TiN), tantalum nitride (TaN), titanium carbide (TiC), tantalum carbide (TaC), or a combination thereof, but the example embodiments of the present disclosure are not limited thereto.

Further, the first work function metal pattern 150' may be formed of a multi-layer structure in which a plurality of thin metal layers is laminated. For example, the first work function metal pattern 150' may be formed of $Al_2O_3$/TiN, $Al_2O_3$/TaN, Al/TiN, Al/TaN, TiN/Al/TiN, TaN/Al/TaN, TiN/TiON, TaN/TiON, Ta/TiN, TaN/TiN, or combinations thereof.

The second work function metal pattern 160' may be disposed on the substrate 100 of the boundary region (INTERFACE) and the core region (CORE). Specifically, the second work function metal pattern 160' may be disposed on the boundary element isolation layer 110a, the first work function metal pattern 150' or the high-k dielectric layer 140 in the boundary region (INTERFACE). Further, the second work function metal pattern 160' may be disposed on the high-k dielectric layer 140 in the core region (CORE).

More specifically, the second work function metal pattern 160' may be disposed on the first work function metal pattern 150' in the first region I. Further, the second work function metal pattern 160' may be disposed on the high-k dielectric layer 140 in the second region II. That is, the second work function metal pattern 160' may be disposed on the first work function metal pattern 150' of the first region I, and may be disposed on the high-k dielectric layer 140 of the second region II.

In some example embodiments, the second region II may be a region in which the NMOS transistor is formed. That is, the substrate 100 of the second region II may be doped with a p-type impurity. That is, the second work function metal pattern 160' disposed on the high-k dielectric layer 140 of the second region II may be a metal layer which adjusts the threshold voltage of the NMOS transistor.

For example, the second work function metal pattern 160' may contain lanthanum (La), tantalum (Ta), tantalum nitride (TaN), niobium (Nb), titanium nitride (TiN), or a combination thereof. However, the example embodiments of the present disclosure are not limited thereto.

Further, the second work function metal pattern 160' may also be formed of a multi-layer structure in which a plurality of thin metal layers is laminated. For example, the second work function metal pattern 160' may be selected from TiN/TiON, Mg/TiN, TiN/Mg/TiN, La/TiN, TiN/La/TiN, Sr/TiN, TiN/Sr/TiN, or combinations thereof.

The first to third conductive layers 222, 224 and 226 may be disposed on the second work function metal pattern 160'. That is, the first to third conductive layers 222, 224 and 226 forming the bit line pattern 220 in the cell region (CELL) may also be disposed in the core region (CORE).

Specifically, the first to third conductive layers 222, 224 and 226 are sequentially laminated on the second work function metal pattern 160' in the first and second regions I and II. Further, the first to third conductive layers 222, 224 and 226 may be laminated on the second work function metal pattern 160' in the boundary region (INTERFACE). In some example embodiments, the first to third conductive layers 222, 224 and 226 may completely cover the second work function metal pattern 160'.

The capping layer 230 may be disposed on the first to third conductive layers 222, 224 and 226. That is, the capping layer 230 disposed on the bit line pattern 220 in the cell region (CELL) may also be disposed in the core region (CORE).

The gate spacer 240 may be disposed on side walls of the gate insulating layer 130, the high-k dielectric layer 140, and the first and second work function metal patterns 150' and 160'.

Specifically, the gate spacer 240 may be disposed on the side walls of the gate insulating layer 130, the high-k dielectric layer 140, the first and second work function metal patterns 150' and 160', the first to third conductive layers 222, 224 and 226, and the capping layer 230 in the first region I.

Further, the gate spacer 240 may be disposed on the side walls of the gate insulating layer 130, the high-k dielectric layer 140, the second work function metal pattern 160', the first to third conductive layers 222, 224 and 226, and the capping layer 230 in the second region II.

Hereinafter, the boundary region of the semiconductor device according to some example embodiments of the present inventive concepts will be specifically described with reference to FIGS. 3 and 4a.

As described above, the high-k dielectric layer 140, the first work function metal pattern 150', and the second work function metal pattern 160' may be disposed on the substrate 100 of the boundary region (INTERFACE) and the core region (CORE).

Specifically, the high-k dielectric layer 140, the first work function metal pattern 150' and the second work function metal pattern 160' disposed on the substrate 100 of the core region (CORE) may extend in the direction toward the cell region (CELL) and may be disposed on the boundary region (INTERFACE). That is, a part of the high-k dielectric layer 140, a part of the first work function metal pattern 150', and a part of the second work function metal pattern 160' may be disposed on the boundary element isolation layer 110a.

At this time, the portion of the first work function metal pattern 150' overlapping the boundary element isolation layer 110a may be defined as a first extension 150a. Here, the expression "the first work function metal pattern 150' overlaps the boundary element isolation layer 110a" means that the first work function metal pattern 150' includes a portion which overlaps the boundary element isolation layer 110a in a third direction intersecting with the first and second directions X and Y.

Similarly, a portion of the second work function metal pattern 160' overlapping the boundary element isolation layer 110a may be defined as the second extension 160a, and a portion of the high-k dielectric layer 140 overlapping the boundary element isolation layer 110a may be defined as the third extension 140a. That is, the first to third extensions 150a, 160a and 140a overlap the first work function metal pattern 150', the second work function metal pattern 160' and the high-k dielectric layer 140 in the third direction Z, respectively.

Further, the first to third extensions 150a, 160a and 140a may extend in the direction from the core region (CORE) toward the cell region (CELL), respectively. For example, the first to third extensions 150a, 160a and 140a may extend in the second direction Y.

In some example embodiments, a first length L1a in which the first extension 150a extends in the second direction Y may be shorter than a second length L2a in which the second extension 160a extends in the second direction Y. That is, the length in which the first extension 150a extends in the direction from the distal end of the boundary region (INTERFACE) adjacent to the core region (CORE) toward the cell region (CELL) may be longer than the length in which the second extension 160a extends in the direction from the distal end of the boundary region (INTERFACE) adjacent to the core region (CORE) toward the cell region (CELL).

Further, a third length L3a in which the third extension 140a extends in the second direction Y may be substantially the same as the second length L2a. Accordingly, the region of the second extension 160a corresponding to the first length L1a may be disposed on the first extension 150a. Further, the region of the second extension 160a corresponding to a difference between the first length L1a and the second length L2a may be disposed on the third extension 140a.

The recess 110r formed on the upper surface of the boundary element isolation layer 110a does not overlap the first and second extensions 150a and 160a and may be adjacent to at least one of the first and second extensions 150a and 160a.

As illustrated, when the first length L1a is shorter than the second length L2a, the recess 110r may be adjacent to the second extension 160a. Also, as illustrated, if the third length L3a is substantially the same as the second length L2a, the recess 110r may be adjacent to the second and third extensions 160a, and 140a. At this time, the recess 110r may not overlap the first and second extensions 150a and 160a.

Hereinafter, the boundary region of the semiconductor device according to some example embodiments of the present inventive concepts will be described with reference to FIG. 4b. For the sake of convenience of description, the repeated parts of the description of FIGS. 1 to 4a will be briefly explained or omitted.

FIG. 4b is a diagram for illustrating a boundary region of a semiconductor device according to some example embodiments of the present inventive concepts.

FIG. 4b is a region corresponding to FIG. 4a. That is, the semiconductor device including the boundary region (INTERFACE) illustrated in FIG. 4b may be the same as the semiconductor device according to FIG. 3, except for a region D.

In some example embodiments, a first length L1b in which the first extension 150b extends in the second direction Y may be longer than a second length L2b in which the second extension 160b extends in the second direction Y. That is, the length in which the first extension 150b extends in the direction from the distal end of the boundary region (INTERFACE) adjacent to the core region (CORE) toward the cell region (CELL) may be longer than the length in which the second extension 160b extends in the direction from the distal end of the boundary region (INTERFACE) adjacent to the core region (CORE) toward the cell region (CELL). Accordingly, the region of the second extension 160b corresponding to the second length L2b may be disposed on the first extension 150b.

Further, the third length L3b in which the third extension 140b extends in the second direction Y may be substantially the same as the first length L1b.

As illustrated, when the first length L1b is longer than the second length L2b, the recess 110r may be adjacent to the first extension 160b. Also, as illustrated, if the third length L3b is substantially the same as the first length L1b, the recess 110r may be adjacent to the first and third extensions 150b and 140b. At this time, the recess 110r may not overlap the first and second extensions 150b and 160b.

Hereinafter, a boundary region of a semiconductor device according to some example embodiments of the present inventive concepts will be described with reference to FIG. 4c. For the sake of convenience of description, the repeated parts of the description of FIGS. 1 to 4a will be briefly explained or omitted.

Figure 4C:
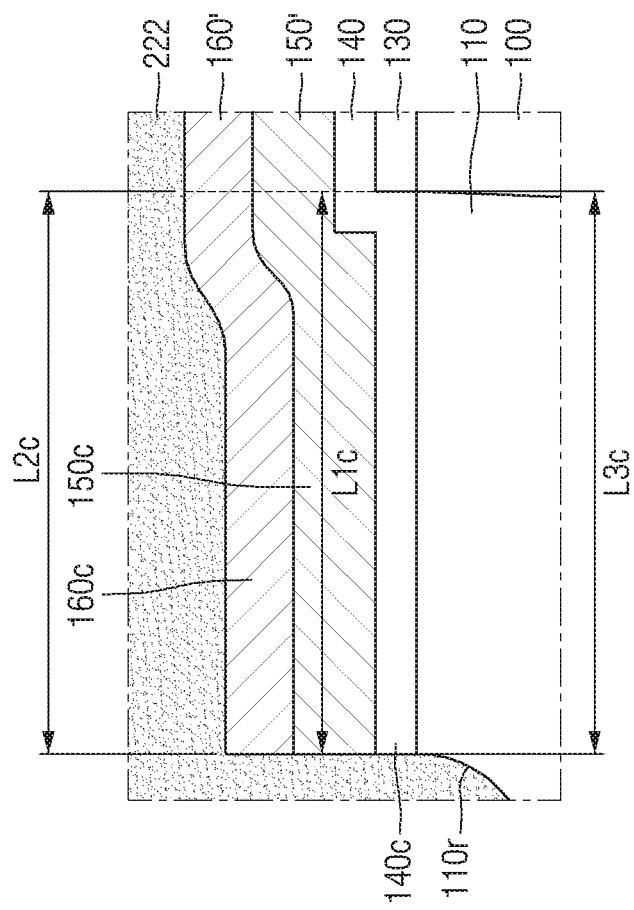
FIG. 4c is a diagram for illustrating a boundary region of a semiconductor device according to some example embodiments of the present inventive concepts.

FIG. 4c is a diagram for illustrating a boundary region of a semiconductor device according to some example embodiments of the present inventive concepts.

FIG. 4c is a region corresponding to FIG. 4a. That is, the semiconductor device including the boundary region (INTERFACE) according to FIG. 4c may be the same as the semiconductor device according to FIG. 3 except for a region D.

In some example embodiments, a first length L1c in which the first extension 150c extends in the second direction Y may be substantially the same as a second length L2c in which the second extension 160c extends in the second direction Y. That is, the length in which the first extension 150c extends in the direction from the distal end of the boundary region (INTERFACE) adjacent to the core region (CORE) toward the cell region (CELL) may be substantially the same as the length in which the second extension 160c extends in the direction from the distal end of the boundary region (INTERFACE) adjacent to the core region (CORE) toward the cell region (CELL). Accordingly, the region of the second extension 160c corresponding to the first and second lengths L1c and L2c may be disposed on the first extension 150c.

Further, a third length L3c in which the third extension 140c extends in the second direction Y may be substantially the same as the first and second lengths L1c and L2c.

As illustrated, when the first length L1c is substantially the same as the second length L2c, the recess 110r may be adjacent to the first and second extensions 150c and 160c. Also, as illustrated, if the third length L3b is substantially the same as the first and second lengths L1b, the recess 110r may be adjacent to the first to third extensions 150b, 160b and 140b. At this time, the recess 110r may not overlap the first and second extensions 150c and 160c.

Thus, in the semiconductor device according to some example embodiments of the present inventive concepts, it is possible to provide a semiconductor device with an improved degree of integration and reliability, while forming a high-k dielectric layer only in the core region.

The high-k dielectric layer 140 is not disposed on the substrate 100 of the cell region (CELL), and may be disposed on the substrate 100 of the core region (CORE). That is, the high-k dielectric layer 140 may be disposed only in the core region (CORE), without changing the structure of the bit line BL of the cell region (CELL). Therefore, a high-performance transistor driven with low power may be provided in the core region (CORE).

In addition, the gate insulating layer 130, the high-k dielectric layer 140, and the first and second work function metal patterns 150' and 160' disposed in the core region (CORE) may extend to a part of the interface region (INTERFACE). That is, the gate insulating layer 130, the high-k dielectric layer 140, the first and second work function metal patterns 150' and 160' may also be disposed on the substrate 100 of the core region (CORE) adjacent to the boundary region (INTERFACE). Accordingly, the substrate 100 of the core region (CORE) adjacent to the boundary region (INTERFACE) may also be used as a transistor. That is, the area of the core region (CORE) may be minimized, and the degree of integration of the semiconductor memory element may be improved.

Further, the recess 110r formed on the boundary element isolation layer 110a may prevent a short circuit between the cell region (CELL) and the core region (CORE). That is, by forming the recess 110r on the boundary element isolation layer 110a, it is possible to prevent the first or second work function metal pattern 150', 160' from extending to the cell region (CELL). Therefore, the reliability of the semiconductor memory element may be improved.

Hereinafter, a method of fabricating a semiconductor device according to some example embodiments of the present inventive concepts will be described with reference to FIGS. 5 to 16. For the sake of convenience of explanation, the repeated parts of the description of FIGS. 1 to 4c will be briefly explained or omitted.

FIGS. 5 to 16 are intermediate step diagram for explaining a method for fabricating a semiconductor device according to some example embodiments of the present inventive concepts.

Referring to FIG. 5, an element isolation layer 110 and a word line pattern 120 are provided on the substrate 100.

Specifically, the element isolation layer 110 may be formed on the substrate 100 of the cell region (CELL), the core region (CORE) and the boundary region (INTERFACE). At this time, the boundary element isolation layer 110a may be formed on the substrate 100 of the boundary region (INTERFACE).

Subsequently, a word line trench may be formed on the substrate 100 of the cell region (CELL). A buried dielectric layer 126, a buried conductive layer 124, and a buried insulating layer 122 may be sequentially buried in the formed word line trench to form the word line pattern 120. At this time, although the word line pattern 120 may be formed on the element isolation layer 110, the example embodiments of the present disclosure are not limited thereto, and the word line pattern 120 may not be formed on the element isolation layer 110.

Figure 6:
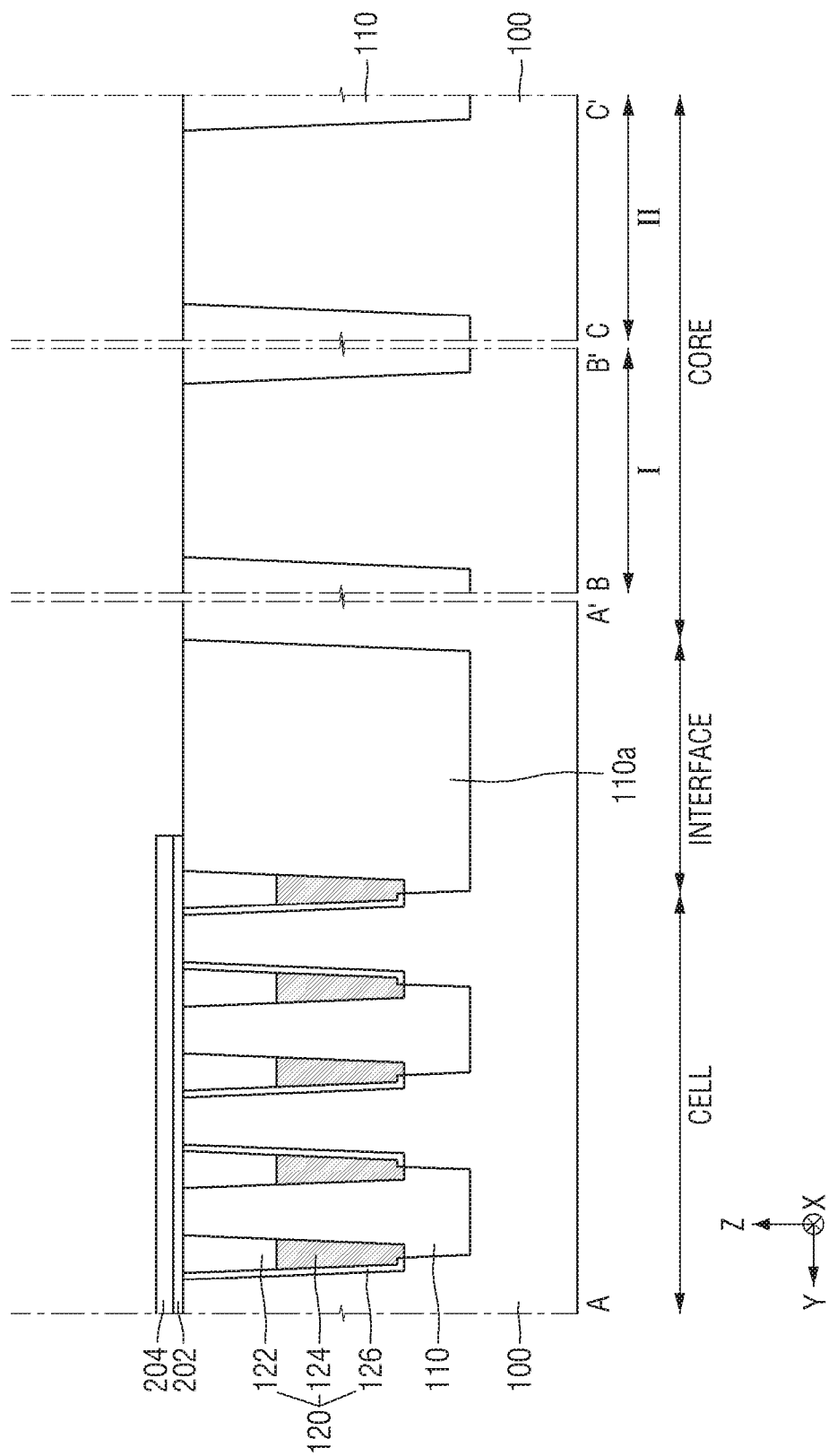

Referring to FIG. 6, first and second insulating layers 202 and 204 are formed on the substrate 100 of the cell region (CELL).

Specifically, the first and second insulating layers 202 and 204 are sequentially formed on the substrate 100, the element isolation layer 110 and the word line pattern 120 of the cell region (CELL).

Although the first insulating layer 202 may be formed of an oxide layer and the second insulating layer 204 may be formed of a nitride layer, the example embodiments of the present disclosure are not limited thereto.

Figure 7:
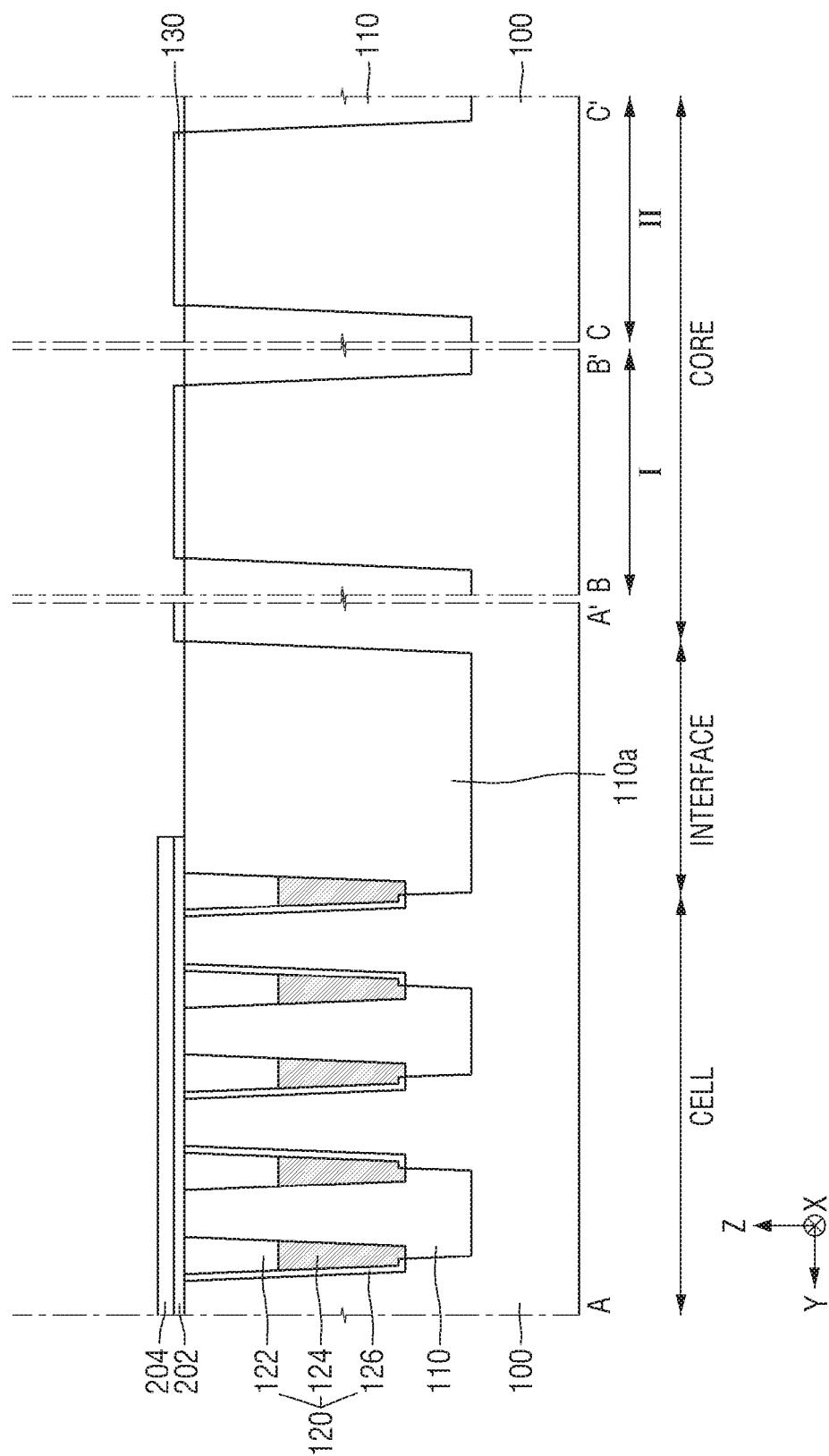

Referring to FIG. 7, a gate insulating layer 130 is formed on the substrate 100 of the core region (CORE).

For example, the gate insulating layer 130 may be formed by oxidization of the substrate 100. Accordingly, the gate insulating layer 130 may include an oxide of the substrate 100. Further, the gate insulating layer 130 may be formed on the substrate 100 of the core region (CORE), and may not be formed on the element isolation layer 110.

However, the example embodiments of the present disclosure are not limited thereto, and the gate insulating layer 130 may be formed on the substrate 100 and the element isolation layer 110 of the core region (CORE) by another process such as ALD (atomic layer deposition). Further, the gate insulating layer 130 may be formed on the boundary element isolation layer 110a.

Figure 8:
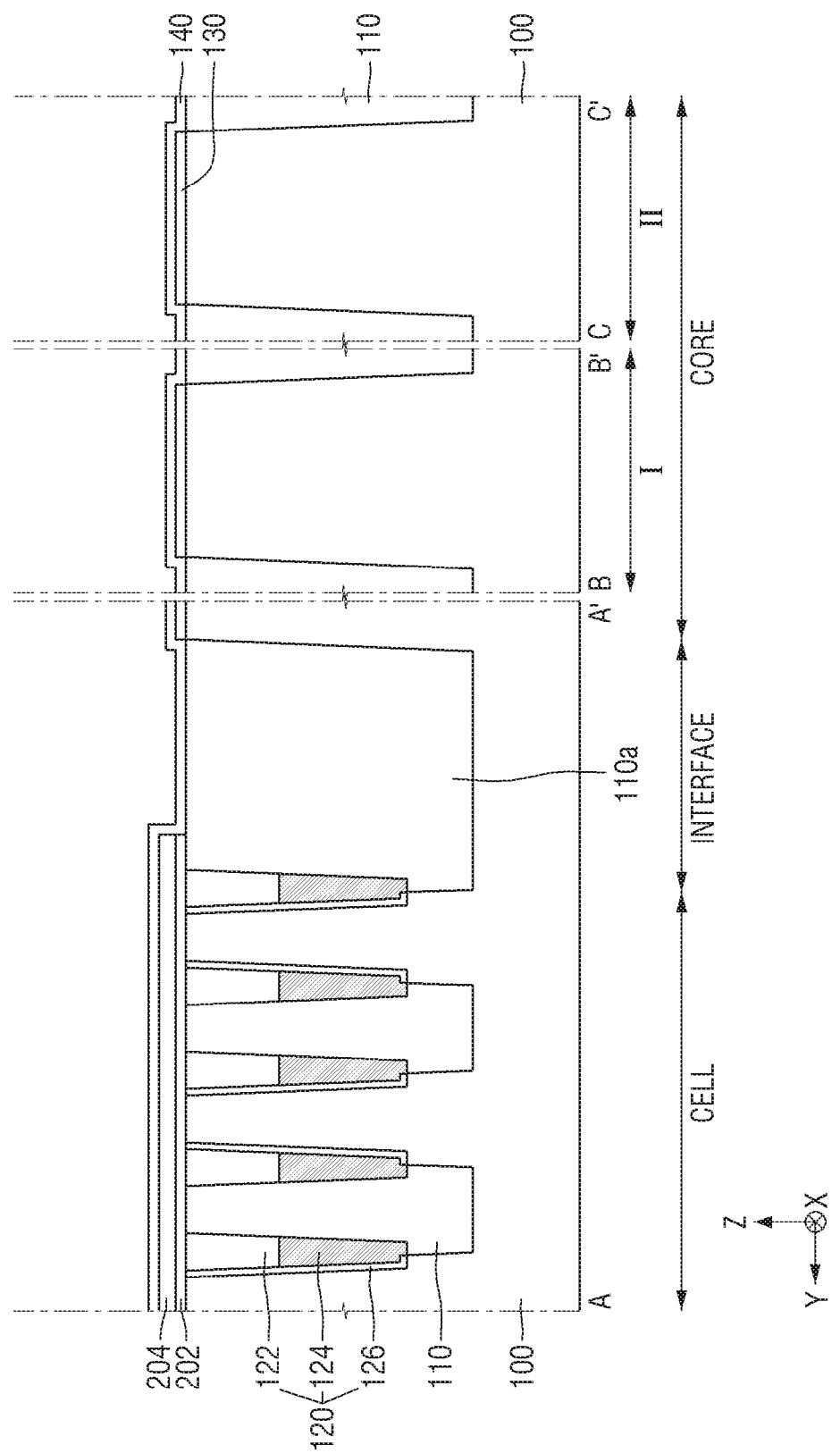

Referring to FIG. 8, the high-k dielectric layer 140 is formed on the result of FIG. 7.

For example, the high-k dielectric layer 140 may be formed on the substrate 100 by a process such as a chemical vapor deposition (CVD) or an atomic layer deposition (ALD).

Accordingly, the high-k dielectric layer 140 may be conformally formed on the result of FIG. 7. That is, the high-k dielectric layer 140 may be formed on the first and second insulating layers 202 and 204 in the cell region (CELL), may be formed on the boundary element isolation layer 110a in the boundary region (INTERFACE), and may be formed on the gate insulating layer 130 in the core region (CORE).

Figure 9:
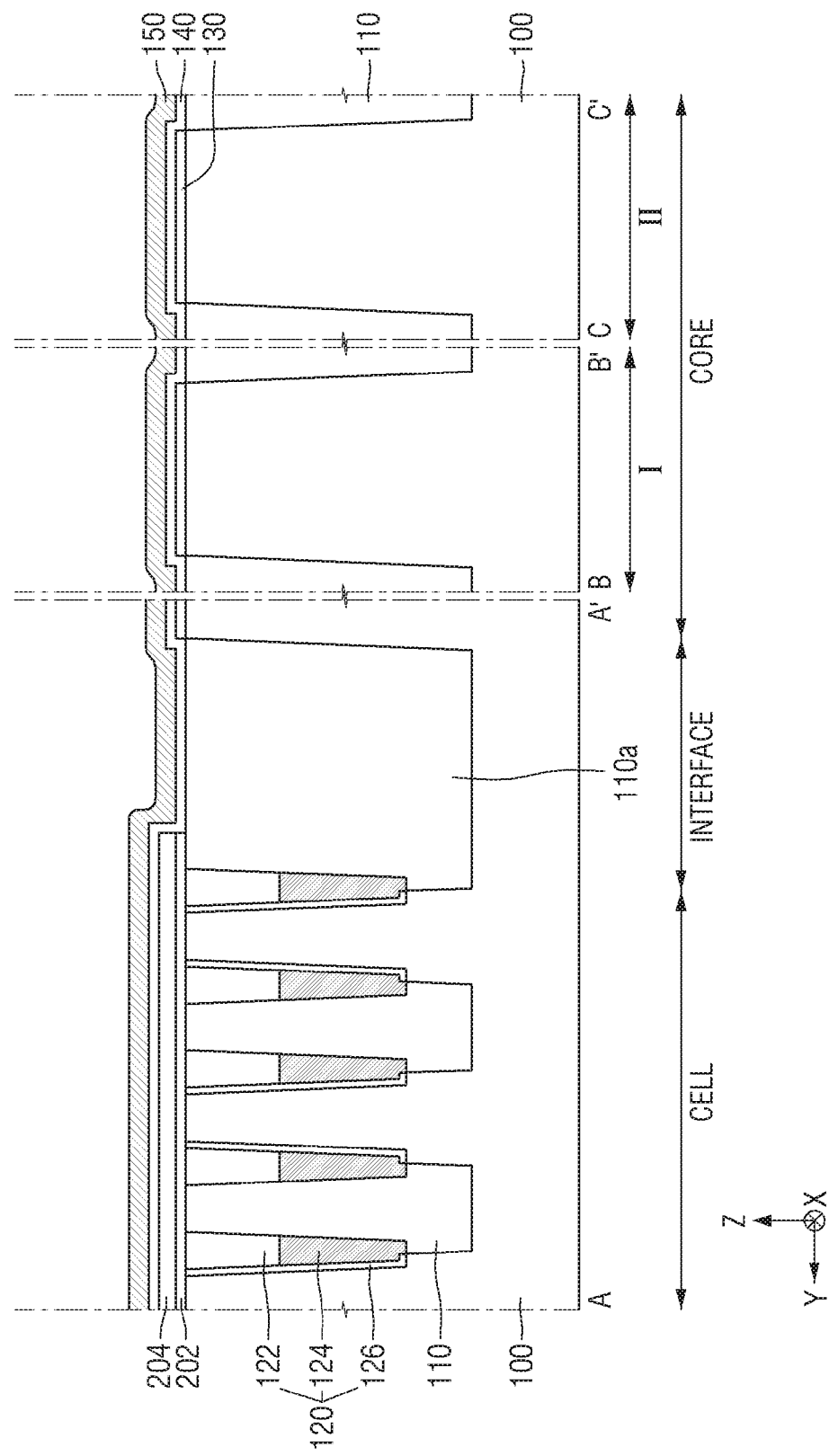

Referring to FIG. 9, a first work function metal layer 150 is formed on the high-k dielectric layer 140. The first work function metal layer 150 may be conformally formed on the high-k dielectric layer 140.

For example, the first work function metal layer 150 may be formed of tungsten (W), tantalum (Ta), aluminum (Al), ruthenium (Ru), platinum (Pt), titanium nitride (TiN), tantalum nitride (TaN), titanium carbide (TiC), tantalum carbide (TaC), or a combination thereof.

Further, the first work function metal layer 150 may be formed with a multi-layer structure by laminating a plurality of thin metal layers. For example, the first work function metal layer 150 may be formed of $Al_2O_3$/TiN, $Al_2O_3$/TaN, Al/TiN, Al/TaN, TiN/Al/TiN, TaN/Al/TaN, TiN/TiON, TaN/TiON, Ta/TiN, TaN/TiN, or a combination thereof.

Figure 10:
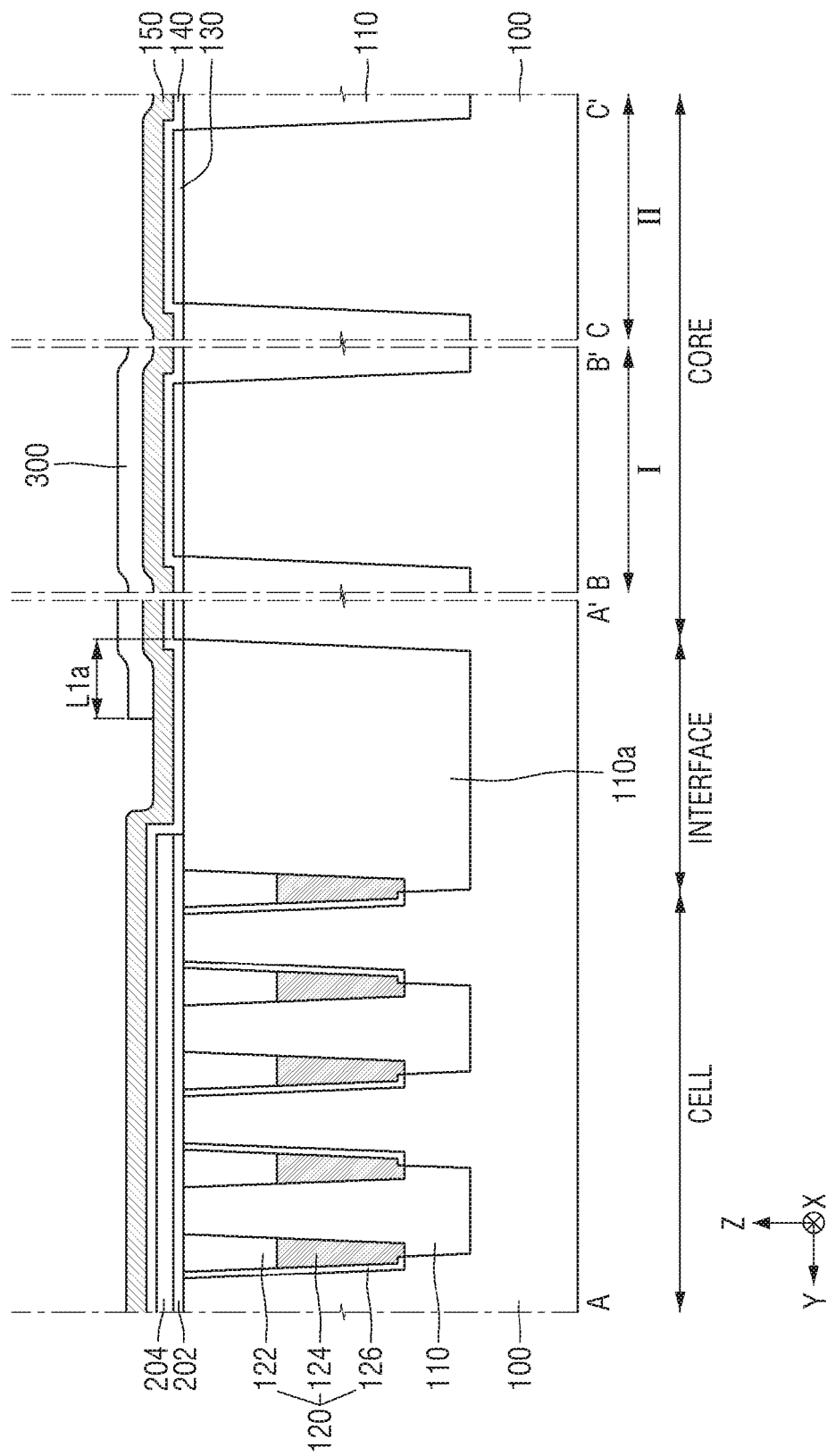

Referring to FIG. 10, a first photoresist 300 is formed on the first work function metal layer 150.

Specifically, the first photoresist 300 may be formed to overlap at least a part of the boundary element isolation layer 110a and the first region I. Further, the first photoresist 300 may be formed so as not to overlap the second region II.

At this time, the first photoresist 300 may be formed to overlap the boundary element isolation layer 110a by a first length L1. That is, the first photoresist 300 may extend by a first length L1 in the direction from the distal end of the boundary region (INTERFACE) adjacent to the core region (CORE) toward the cell region (CELL).

Figure 11:
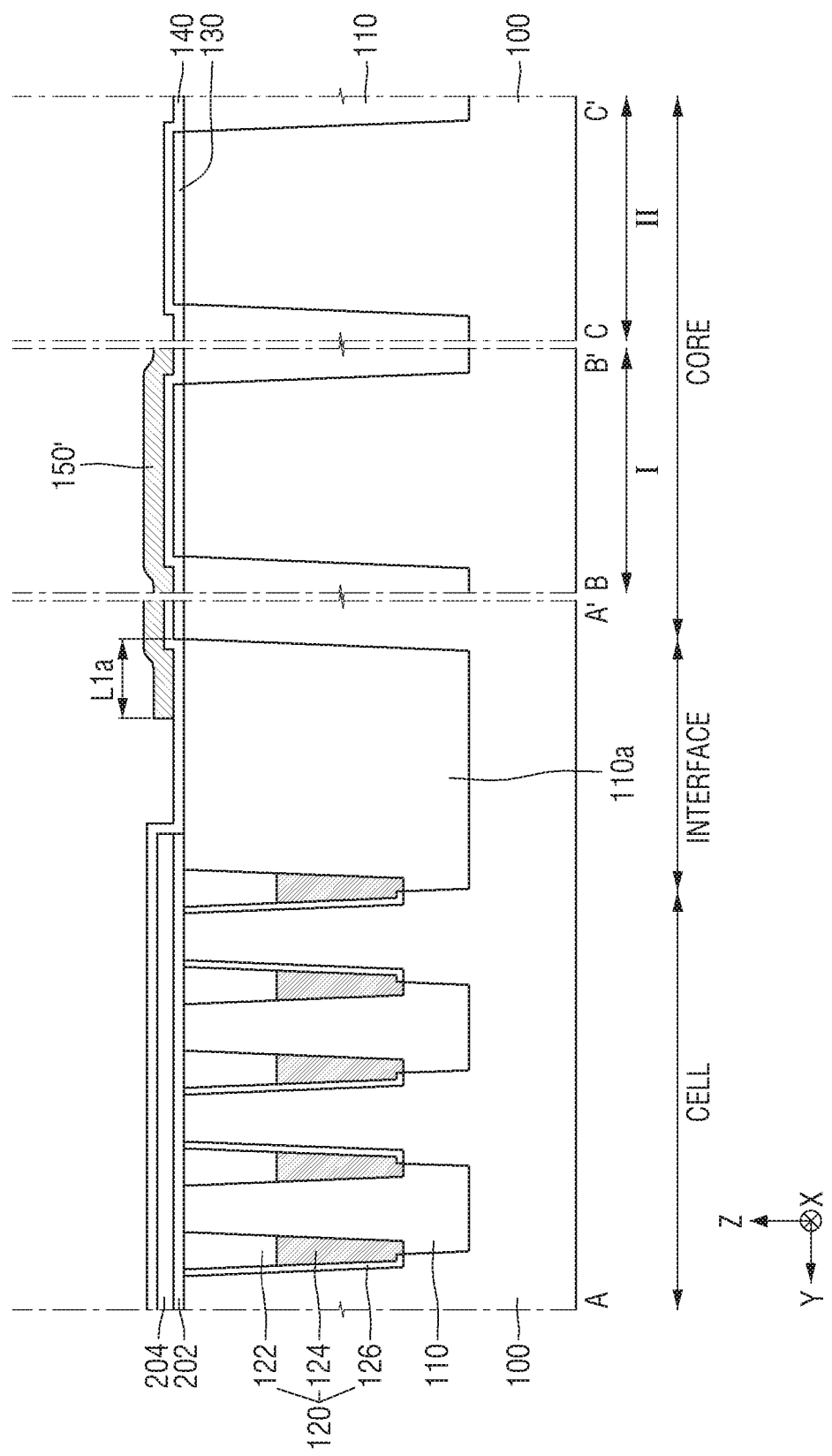

Referring to FIG. 11, the first work function metal layer 150 is patterned using the first photoresist 300 as an etch mask. As a result, the first work function metal layer 150 may be patterned to form the first work function metal pattern 150'.

Specifically, the first work function metal pattern 150' may be performed by a photolithography process. That is, the first work function metal layer 150 which does not overlap the first photo resist 300 is removed, the remaining first work function metal layer 150 may form the first work function metal pattern 150'.

As a result, the first work function metal pattern 150' may extend by the first length L1 in the direction from the distal end of the boundary region (INTERFACE) adjacent to the core region (CORE) toward the cell region (CELL).

After forming the first work function metal pattern 150', the first photoresist 300 may be removed.

In some example embodiments, the high-k dielectric layer 140 may be used as an etch stop layer. As a result, when the first work function metal layer 150 is patterned, the high-k dielectric layer 140 may not be patterned.

Figure 12:
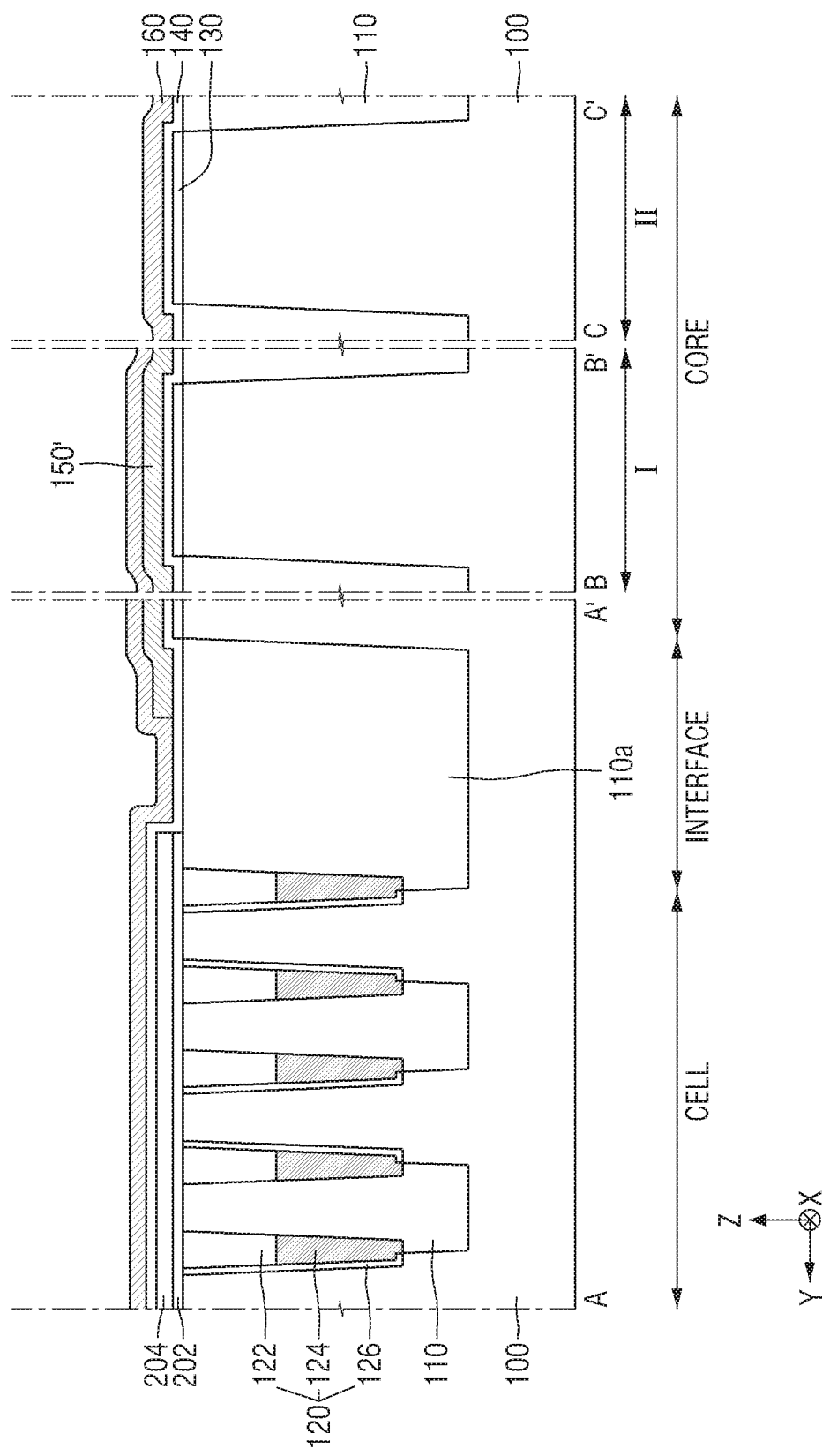

Referring to FIG. 12, a second work function metal layer 160 is formed on the result of FIG. 11. The second work function metal layer 160 may be conformally formed on the resultant of FIG. 11.

For example, the second work function metal layer 160 may be formed of lanthanum (La), tantalum (Ta), tantalum nitride (TaN), niobium (Nb), titanium nitride (TiN), or a combination thereof.

Further, the second work function metal layer 160 may be formed of a multi-layer structure by laminating a plurality of thin metal layers. For example, the second work function metal layer 160 may be formed of TiN/TiON, Mg/TiN, TiN/Mg/TiN, La/TiN, TiN/La/TiN, Sr/TiN, TiN/Sr/TiN, or a combination thereof.

Figure 13:
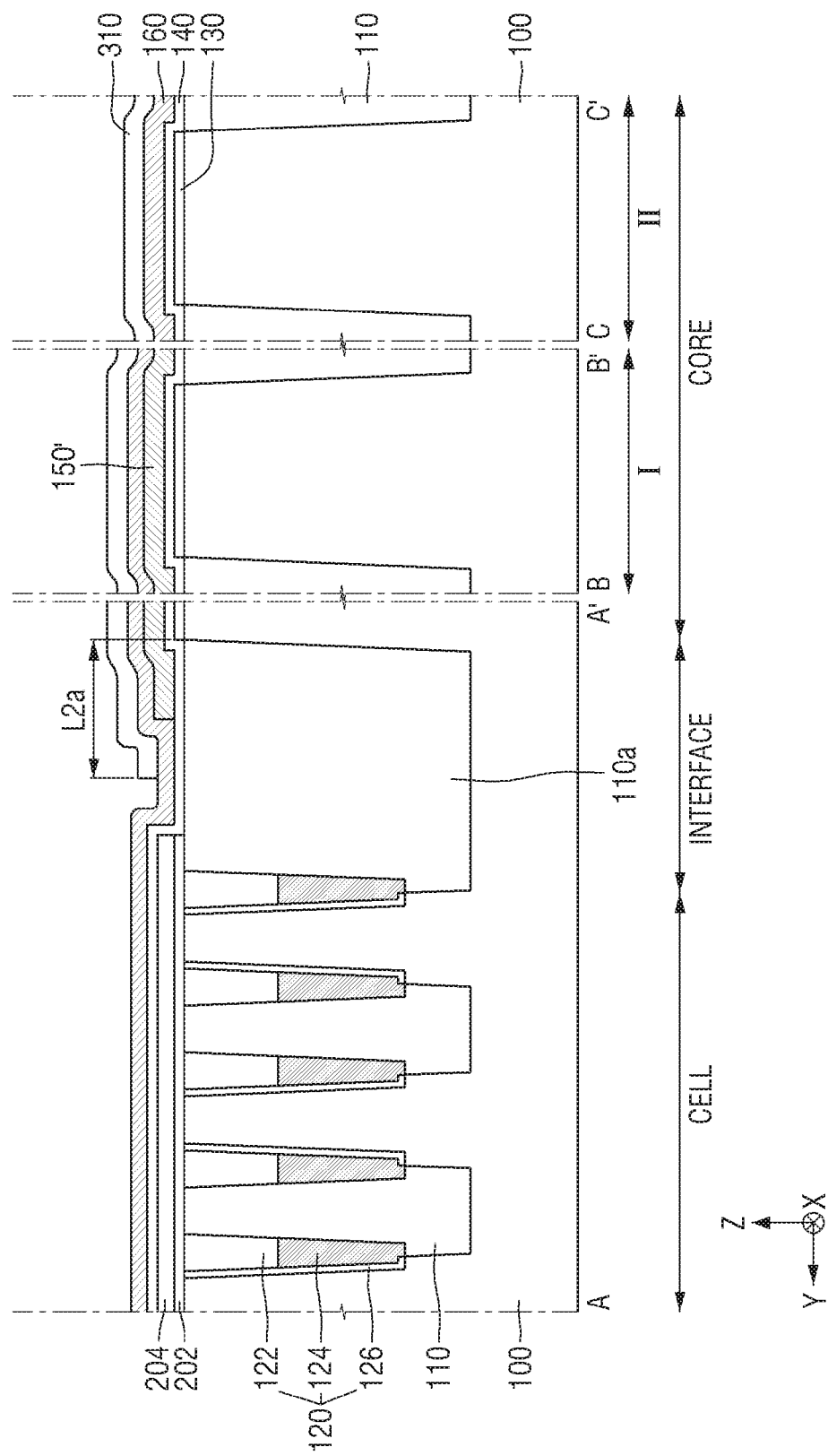

Referring to FIG. 13, a second photoresist 310 is formed on the second work function metal layer 160.

Specifically, the second photoresist 310 may be formed to overlap at least a part of the boundary element isolation layer 110a and the first and second regions I and II.

At this time, the second photoresist 310 may be formed to overlap the boundary element isolation layer 110a by the second length L2. That is, the second photoresist 310 may extend by the second length L2 in the direction from the distal end of the boundary region (INTERFACE) adjacent to the core region (CORE) toward the cell region (CELL).

In some example embodiments, the second length L2 may be formed to be different from the first length L1. That is, formation of the second photoresist 310 may include formation of the length of the second photoresist 310 overlapping the boundary element isolation layer 110a different from the length of the first photoresist 300 overlapping the boundary element isolation layer 110a.

For example, when the second length L2 is formed to be longer than the first length L1, the second photoresist 310 may completely cover the first work function metal pattern 150'.

Figure 14:
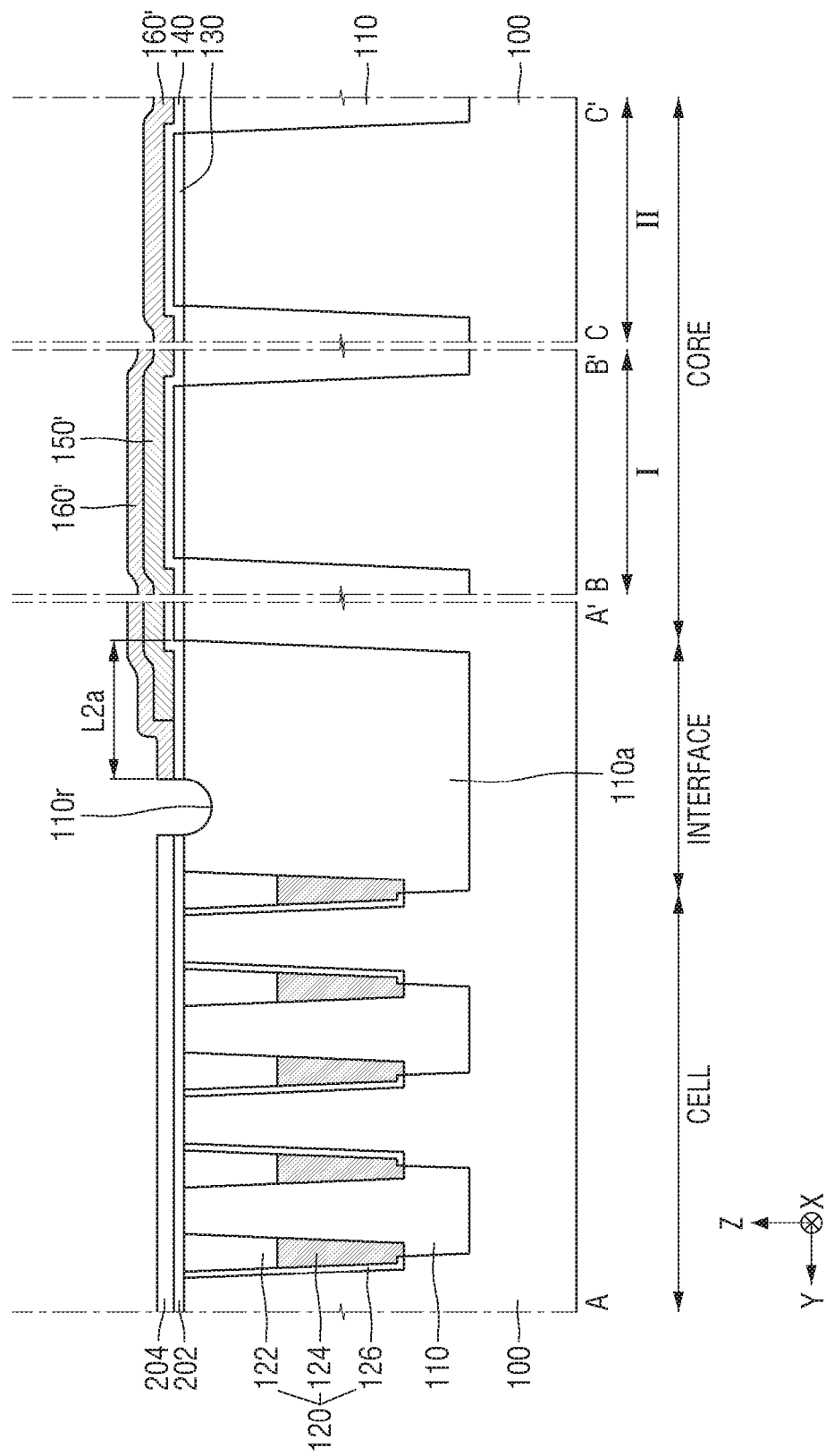

Referring to FIG. 14, the second work function metal layer 160 is patterned using the second photoresist 310 as an etching mask. Thus, the second work function metal layer 160 may be patterned to form the second work function metal pattern 160'.

Specifically, formation of the second work function metal pattern 160' may be performed by a photolithography process. That is, the second work function metal layer 160 which does not overlap the second photoresist 310 is removed, and the remaining second work function metal layer 160 may form the second work function metal pattern 160'.

As a result, the second work function metal pattern 160' may extend by a second length L2 in the direction from the distal end of the boundary region (INTERFACE) adjacent to the core region (CORE) toward the cell region (CELL).

After forming the second work function metal pattern 160', the second photoresist 310 may be removed.

In some example embodiments, the second work function metal layer 160 and the high-k dielectric layer 140 may be simultaneously patterned, using the second photoresist 310 as an etching mask. That is, patterning of the second work function metal layer 160 may include patterning of the high-k dielectric layer 140, using the second photoresist 310 as an etching mask.

For example, when the second length L2 is formed to be longer than the first length L1, the second work function metal pattern 160' and the high-k dielectric layer 140 may extend by the second length L2 in the direction from the distal end of the boundary region (INTERFACE) adjacent to the cell region (CORE) toward the cell region (CELL).

At this time, a part of the upper portion of the boundary element isolation layer 110a may be etched to form the recess 110r. Specifically, the second work function metal layer 160 and the high-k dielectric layer 140 exposed by the second photoresist 310 may be patterned to expose a part of the upper portion of the boundary element isolation layer 110a. As a result, a part of the upper portion of the exposed boundary element isolation layer 110a may be etched to form the recess 110r.

For example, when the second length L2 is formed to be longer than the first length L1, the recess 110r may be formed to be adjacent to the second work function metal layer 160 and the high-k dielectric layer 140.

Figure 15:
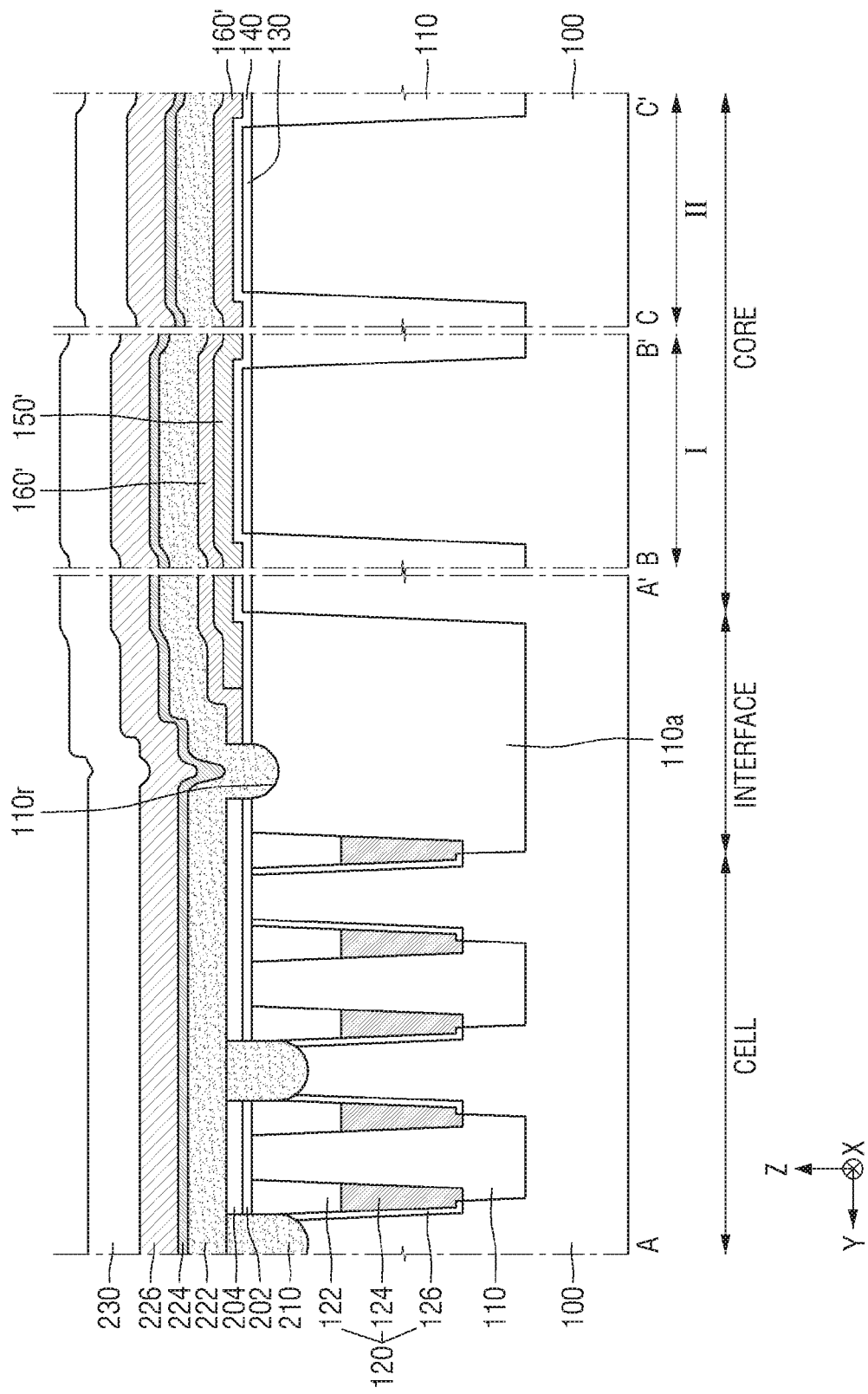

Referring to FIG. 15, a direct contact pattern 210 is formed on the substrate 100 of the cell region (CELL). Subsequently, the first to third conductive layers 222, 224 and 226 and the capping layer 230 are sequentially laminated on the substrate 100.

Specifically, a direct contact trench may be formed through the first and second insulating layers 202 and 204 to expose a part of the substrate 100 of the cell region (CELL). Subsequently, the direct contact trench is buried and the direct contact pattern 210 may be formed.

Subsequently, the first to third conductive layers 222, 224 and 226 and the capping layer 230 may be conformally formed on the substrate 100. The first conductive layer 222 may include, for example, the same material as the direct contact pattern 210, but the example embodiments of the present disclosure are not limited thereto.

Figure 16:
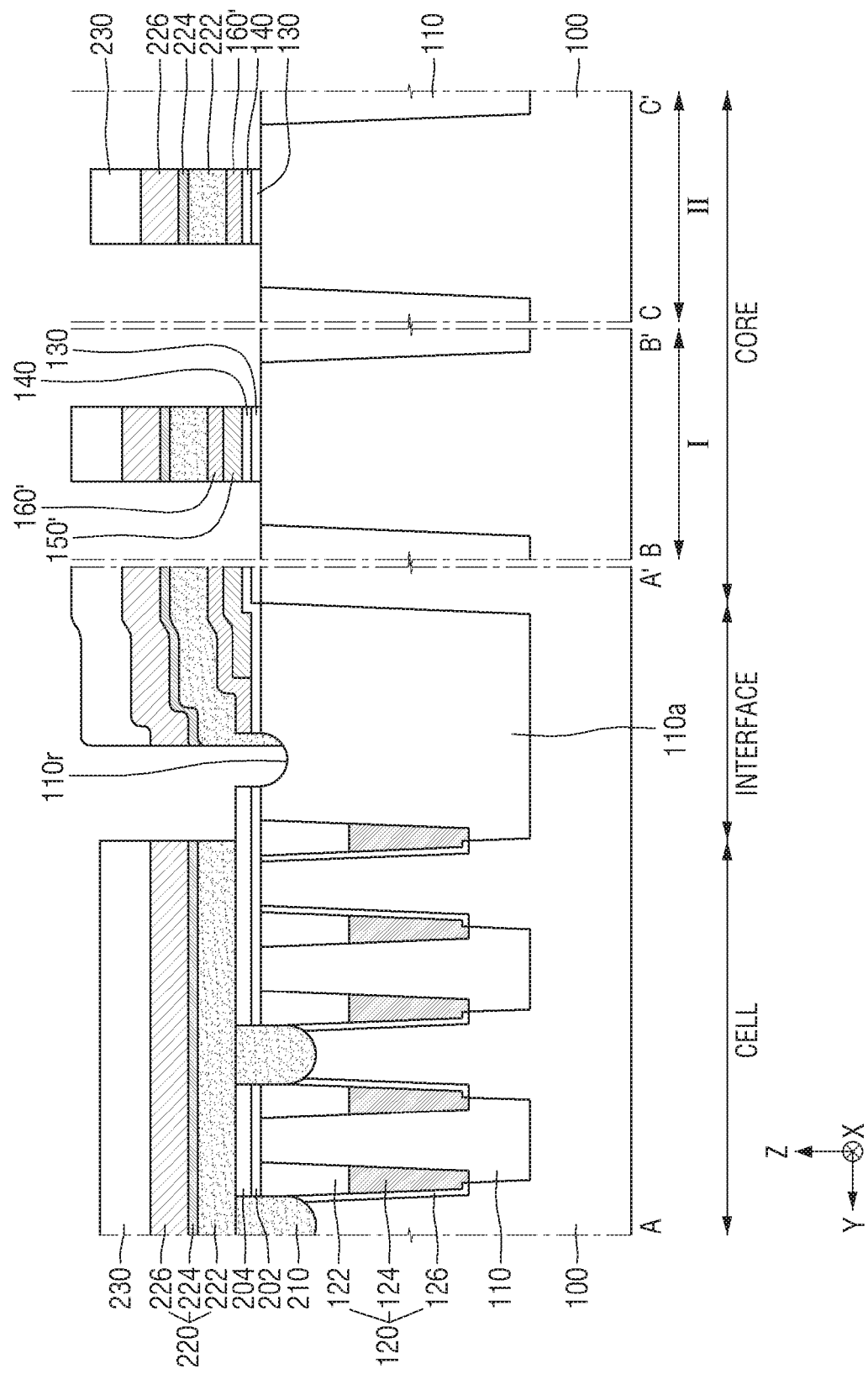

Referring to FIG. 16, the result of FIG. 15 is patterned. Subsequently, a gate spacer 240 is formed on the side wall of the structure formed in the first and second regions I and II. Therefore, the semiconductor device according to FIG. 3 may be formed.

For example, in FIG. 13, when the second length L2 is formed to be longer than the first length L1, the boundary region (INTERFACE) of the semiconductor device according to some example embodiments of the present inventive concepts may be the same as that of FIG. 4a.

For example, in FIG. 13, when the second length L2 is formed to be shorter than the first length L1, the boundary region (INTERFACE) of the semiconductor device according to some example embodiments of the present inventive concepts may be the same as that of FIG. 4b.

For example, in FIG. 13, when the second length L2 is formed to be substantially the same as the first length L1, the boundary region (INTERFACE) of the semiconductor device according to some example embodiments of the present inventive concepts may be the same as that of FIG. 4c.

Accordingly, the method for fabricating the semiconductor device according to some example embodiments of the present inventive concepts may provide a method for fabricating a semiconductor device in which the degree of integration and reliability are improved, while forming a high-k dielectric layer only in the core region.

While the present inventive concepts have been particularly illustrated and described with reference to exemplary embodiments thereof, it will be understood by those of ordinary skill in the art that various changes in form and detail may be made therein without departing from the spirit and scope of the present inventive concepts as defined by the following claims. The example embodiments should be considered in a descriptive sense only and not for purposes of limitation.

What is claimed is:

1. A method for fabricating a semiconductor device, the method comprising:
provides a substrate including a cell region and a core region, the core region including first and second regions;
forming a boundary element isolation layer in the substrate between the cell region and the core region;
forming a high-k dielectric layer on the substrate;
forming a first work function metal layer on the high-k dielectric layer;
forming a first photoresist on the first work function metal layer, the first photoresist overlapping at least a part of the boundary element isolation layer and the first region and not overlapping the second region;
patterning the first work function metal layer using the first photoresist as an etch mask;
forming a second work function metal layer on the substrate and the patterned first work function metal layer;
forming a second photoresist on the second work function metal layer, the second photoresist overlapping at least a part of the boundary element isolation and the first and second regions and not overlapping the cell region; and
patterning the second work function metal layer and the high-k dielectric layer using the second photoresist as an etch mask.

2. The method for fabricating the semiconductor device of claim 1, wherein a first length of the first photoresist overlapping the boundary element isolation layer is different from a second length of the second photoresist overlapping the boundary element isolation layer.

3. The method for fabricating the semiconductor device of claim 2, wherein the first length is shorter than the second length.

4. The method for fabricating the semiconductor device of claim 2, wherein the first length is longer than the second length.

5. The method for fabricating the semiconductor device of claim 1, wherein a first length of the first photoresist overlapping the boundary element isolation layer is substantially the same with a second length of the second photoresist overlapping the boundary element isolation layer.

6. The method for fabricating the semiconductor device of claim 1, further comprising:
etching a part of an upper portion of the boundary element isolation layer exposed by the patterned second work function metal layer and the patterned high-k dielectric layer.

7. The method for fabricating the semiconductor device of claim 1, wherein the first work function metal layer includes at least one of tungsten (W), tantalum (Ta), aluminum (Al), ruthenium (Ru), platinum (Pt), titanium nitride (TiN), tantalum nitride (TaN), titanium carbide (TiC), and tantalum carbide (TaC), and
the second work function metal layer includes at least one of lanthanum (La), tantalum (Ta), tantalum nitride (TaN), niobium (Nb) and titanium nitride (TiN).

8. A method for fabricating a semiconductor device, the method comprising:
providing a substrate including a cell region, a core region, and a boundary region between the cell region and the core region;
forming a boundary element isolation layer in the substrate of the boundary region, the boundary element isolation layer separating the cell region from the core region;
forming a high-k dielectric layer on at least a part of the boundary element isolation layer and the substrate of the core region;
forming a first work function metal pattern including a first extension that extends beyond a first edge of the boundary element isolation layer and overlaps the boundary element isolation layer, the first work function metal pattern being on the high-k dielectric layer; and
forming a second work function metal pattern including a second extension that extends beyond the first edge of the boundary element isolation layer and overlaps the boundary element isolation layer, a portion of one of the first work function metal pattern and the second work function metal pattern being on the other of the first work function metal pattern and the second work function metal pattern on the boundary element isolation layer, and an end of the second extension extending in a direction from the core region towards the cell region overlapping the boundary element isolation layer,
wherein a first length of the first extension between an outer edge of the first work function metal pattern and the first edge of the boundary element isolation layer in a horizontal direction parallel to a top surface of the substrate and extending in the direction from the core region toward the cell region is different from a second length of the second extension between an outer edge of the second work function metal pattern and the first edge of the boundary element isolation layer in the horizontal direction parallel to the top surface of the substrate and extending in the direction from the core region toward the cell region.

9. The method for fabricating the semiconductor device of claim 8, wherein the first length is shorter than the second length.

10. The method for fabricating the semiconductor device of claim 9, wherein the high-k dielectric layer includes a third extension which overlaps the boundary element isolation layer, and
a third length of the third extension extending in the direction from the core region toward the cell region is substantially the same as the second length.

11. The method for fabricating the semiconductor device of claim 9, wherein the boundary element isolation layer includes a recess adjacent to the second extension.

12. The method for fabricating the semiconductor device of claim 8, wherein the first length is longer than the second length.

13. The method for fabricating the semiconductor device of claim 12, wherein the high-k dielectric layer includes a third extension overlapping the boundary element isolation layer, and
a third length of the third extension extending in the direction from the core region toward the cell region is substantially the same as the first length.

14. The method for fabricating the semiconductor device of claim 12, wherein the boundary element isolation layer includes a recess adjacent to the first extension.

15. The method for fabricating the semiconductor device of claim 8, wherein the core region comprises first and second regions,
the first work function metal pattern is on the high-k dielectric layer of the first region, and is not on the substrate of the second region, and
the second work function metal pattern is on the first work function metal pattern of the first region, and is on the high-k dielectric layer of the second region.

16. The method for fabricating the semiconductor device of claim 11, further comprising:
forming a sidewall of a longer one from among the first extension and the second extension, wherein the sidewall is aligned with an edge of the recess.

17. The method for fabricating the semiconductor device of claim 11, wherein the forming the second work function metal pattern forms the second work function metal pattern such that a sidewall of the second extension is aligned with and edge of the recess.

18. The method for fabricating the semiconductor device of claim 14, wherein the forming the first work function metal pattern forms the first work function metal pattern such that a sidewall of the first extension is aligned with an edge of the recess.

* * * * *